(12) United States Patent
Kato et al.

(10) Patent No.: US 7,459,769 B2
(45) Date of Patent: Dec. 2, 2008

(54) MAGNETIC SHIELD MEMBER, MAGNETIC SHIELD STRUCTURE, AND MAGNETIC MEMORY DEVICE

(75) Inventors: Yoshihiro Kato, Tokyo (JP); Yoshinori Ito, Tokyo (JP); Tatsushiro Hirata, Kanagawa (JP); Katsumi Okayama, Kanagawa (JP); Kaoru Kobayashi, Chiba (JP)

(73) Assignee: Sony Corporation, Tokyo (JP)

( * ) Notice: Subject to any disclaimer, the term of this patent is extended or adjusted under 35 U.S.C. 154(b) by 518 days.

(21) Appl. No.: 11/053,650

(22) Filed: Feb. 8, 2005

(65) Prior Publication Data

US 2005/0230788 A1    Oct. 20, 2005

(30) Foreign Application Priority Data

Feb. 23, 2004    (JP)    ............................ P2004-045859

(51) Int. Cl.
*H01L 23/00*    (2006.01)
*H01L 23/02*    (2006.01)
(52) U.S. Cl. .................. 257/659; 257/422; 257/433; 257/E21.114; 257/E21.665; 53/206; 53/371.2
(58) Field of Classification Search ................. 257/421, 257/659, 422, 433
See application file for complete search history.

(56) References Cited

U.S. PATENT DOCUMENTS

| | | | |
|---|---|---|---|
| 4,953,002 A | 8/1990 | Nelson et al. | |
| 5,001,448 A * | 3/1991 | Srivastava et al. | ............ 335/301 |
| 6,350,951 B1* | 2/2002 | Askew | ......................... 174/521 |
| 6,614,102 B1* | 9/2003 | Hoffman et al. | ............. 257/666 |
| 2001/0050175 A1 | 12/2001 | Pulver | |
| 2002/0024116 A1* | 2/2002 | Tuttle | .......................... 257/630 |
| 2003/0052340 A1 | 3/2003 | Tuttle | |
| 2003/0132494 A1 | 7/2003 | Tuttle | |

OTHER PUBLICATIONS

European Search Report dated Feb. 2, 2007.

* cited by examiner

*Primary Examiner*—Dao H Nguyen
(74) *Attorney, Agent, or Firm*—Sonnenschein Nath & Rosenthal LLP

(57) ABSTRACT

It is an object of the invention to relax magnetic saturation and realize a high-performance magnetic shield effect that is suitable for magnetic devices such as an MRAM. A magnetic shield member of the invention is suitable for a magnetic memory device in which a magnetic random access memory (MRAM) consisting of a TMR element formed by stacking a magnetization fixed layer with a direction of magnetization fixed and a magnetic layer, in which a direction of magnetization can be changed, via a tunnel barrier layer is sealed by a sealing material such as resin. A planar shape or a sectional shape of magnetic shield plates provided on the sealing material in order to magnetically shield the MRAM is a shape in which a side substantially perpendicular to a direction of an outer magnetic field and a side substantially parallel to the direction of an outer magnetic field are not orthogonal to each other, in particular, circular, polygonal, or the like, whereby it is possible to relax magnetic saturation of the magnetic shield plate and keep the magnetic shield effect.

9 Claims, 23 Drawing Sheets

IDEAL PLANAR SHAPE OF MAGNETIC SHIELD PLATE AND MAGNETIC LINES OF FORCE

MAGNETIC LINES OF FORCE

OTHER APPLICABLE PLANAR SHAPES
OF MAGNETIC SHIELD PLATE

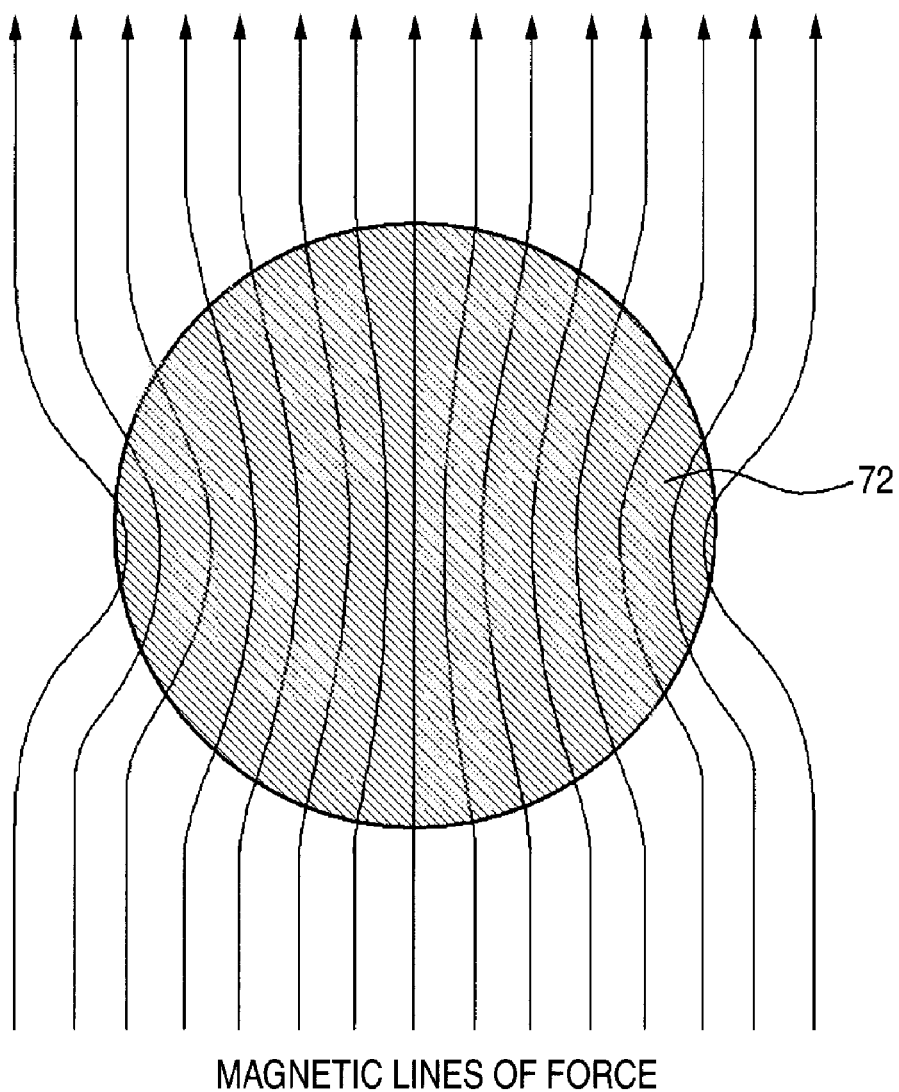

OTHER APPLICABLE SECTIONAL SHAPES
OF MAGNETIC SHIELD PLATE

ANALYSIS OF MAGNETIC SHIELD EFFECT WITH MAGNETIC PLATE (MAGNETIC SHIELD PLATE)

OUTER MAGNETIC FIELD: 7957.75A/m (100 Oe)
23873.24A/m (300 Oe)

($1A/m = 4\pi \times 10^{-3}$ Oe
$1T = 10^4$ GAUSS)

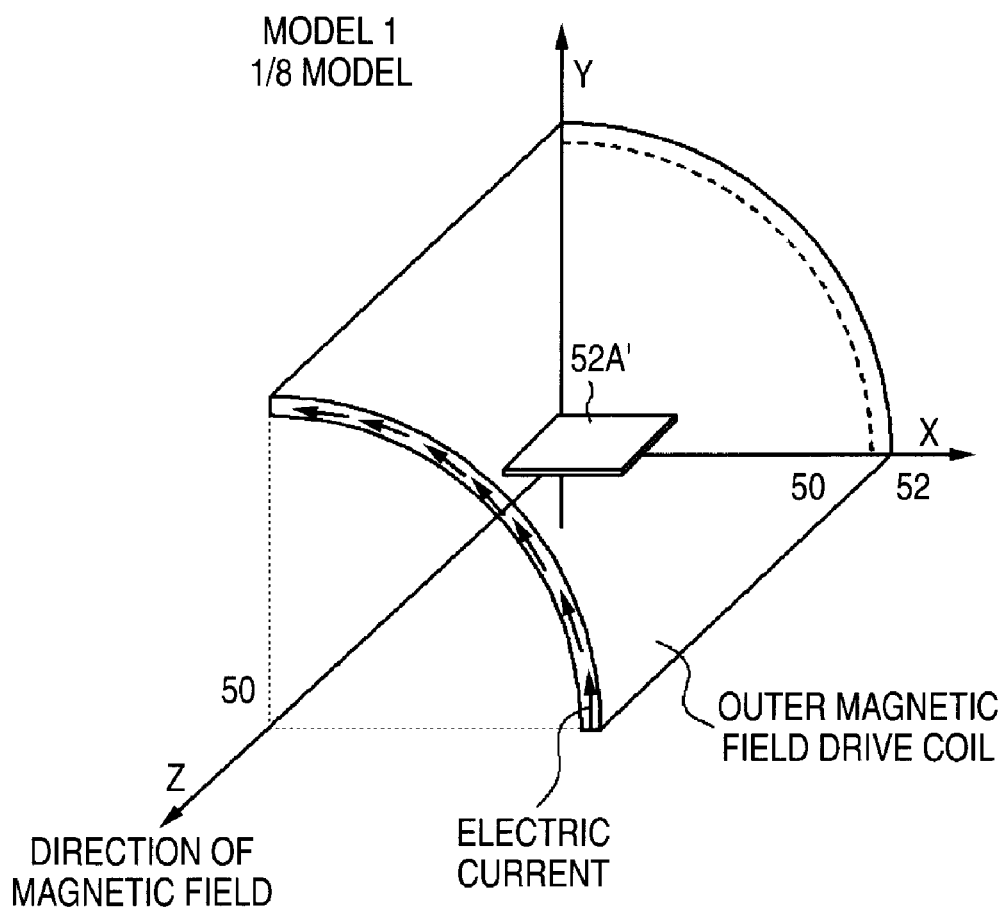

FIG. 9A        MODEL 1
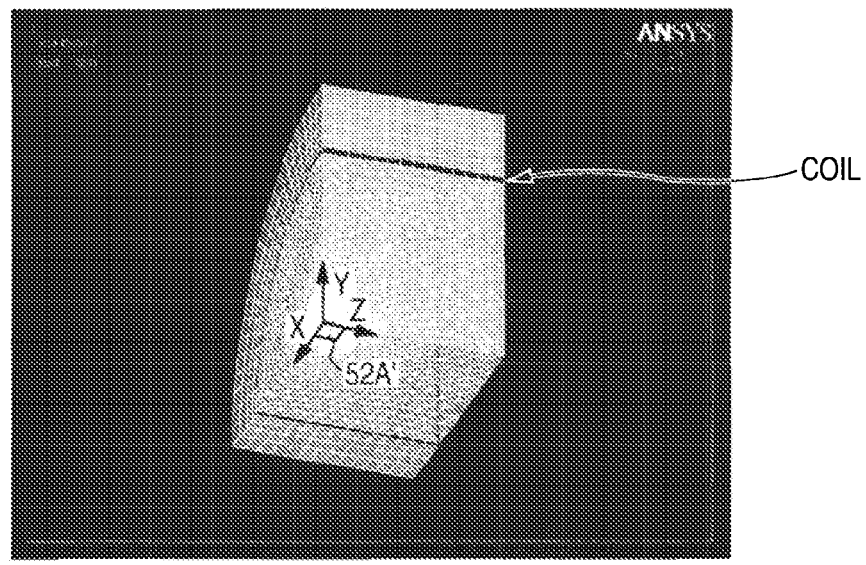
FIG. 9B
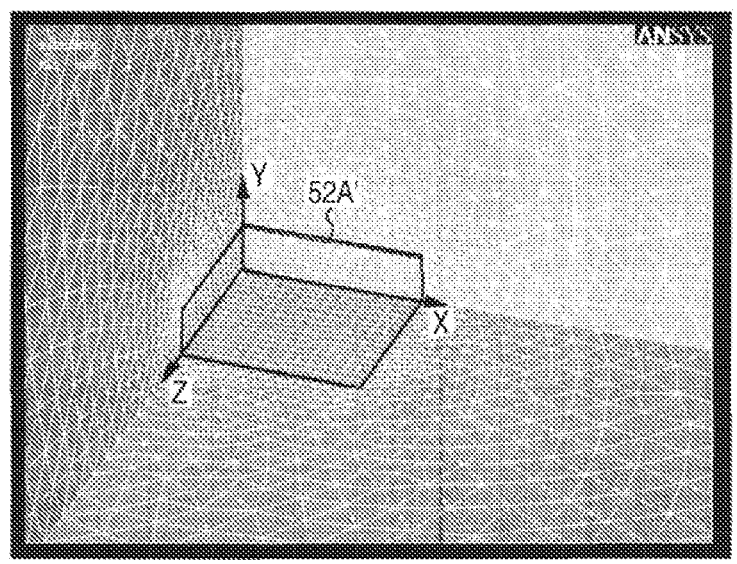

FIG. 11A   MODEL 2
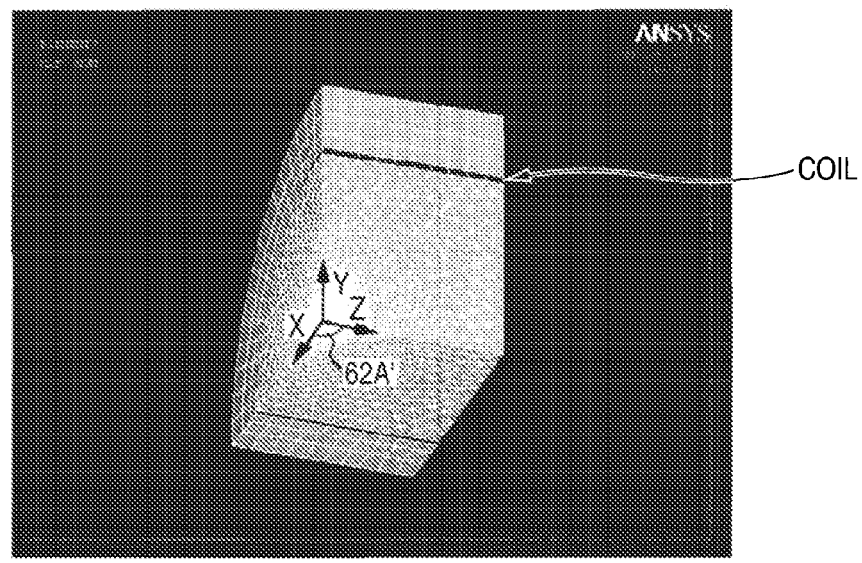
FIG. 11B
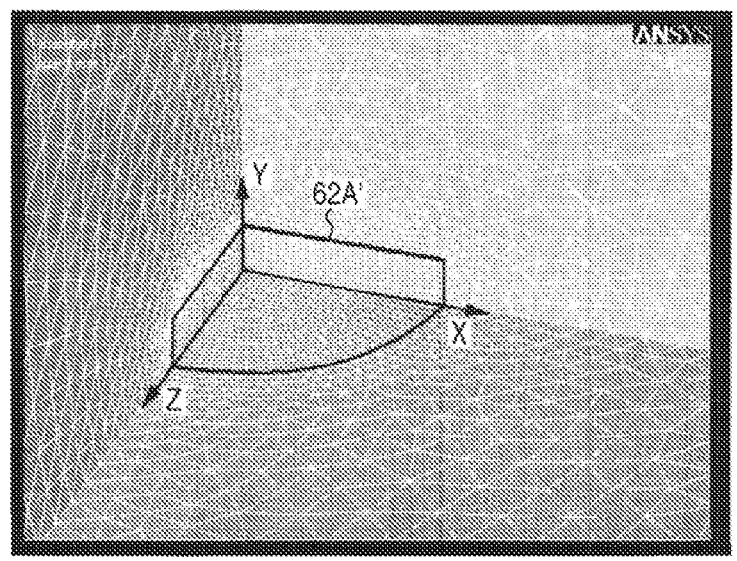

CROSS SECTION

MODEL 1

DIRECTION OF APPLIED MAGNETIC FIELD

PLANE

DIRECTION OF APPLIED MAGNETIC FIELD

CROSS SECTION

MODEL 1

OUTER MAGNETIC FIELD 300Oe (23873.24A/m)

DIRECTION OF APPLIED MAGNETIC FIELD

PLANE

DIRECTION OF APPLIED MAGNETIC FIELD

MODEL 1

MAGNETIZATION INTENSITY IN
SQUARE MAGNETIC SHIELD

OUTER MAGNETIC FIELD 100Oe (7957.75A/m)

DIRECTION OF APPLIED MAGNETIC FIELD

OUTER MAGNETIC FIELD 300Oe (23873.24A/m)

DIRECTION OF APPLIED MAGNETIC FIELD

CROSS SECTION

MODEL 2

OUTER MAGNETIC FIELD 100Oe (7957.75A/m)

DIRECTION OF APPLIED MAGNETIC FIELD

PLANE

DIRECTION OF APPLIED MAGNETIC FIELD

CROSS SECTION

MODEL 2

OUTER MAGNETIC FIELD 300Oe (23873.24A/m)

DIRECTION OF APPLIED MAGNETIC FIELD

PLANE

DIRECTION OF APPLIED MAGNETIC FIELD

MODEL 2

MAGNETIZATION INTENSITY IN
CIRCULAR MAGNETIC SHIELD PLATE

OUTER MAGNETIC FIELD 10Oe (7957.75A/m)

DIRECTION OF APPLIED MAGNETIC FIELD

OUTER MAGNETIC FIELD 30Oe (23873.24A/m)

DIRECTION OF APPLIED MAGNETIC FIELD

MODEL 1
LEAK MAGNETIC FIELD FROM
SQUARE MAGNETIC SHIELD PLATE
FIG. 18A  OUTER MAGNETIC FIELD 100Oe
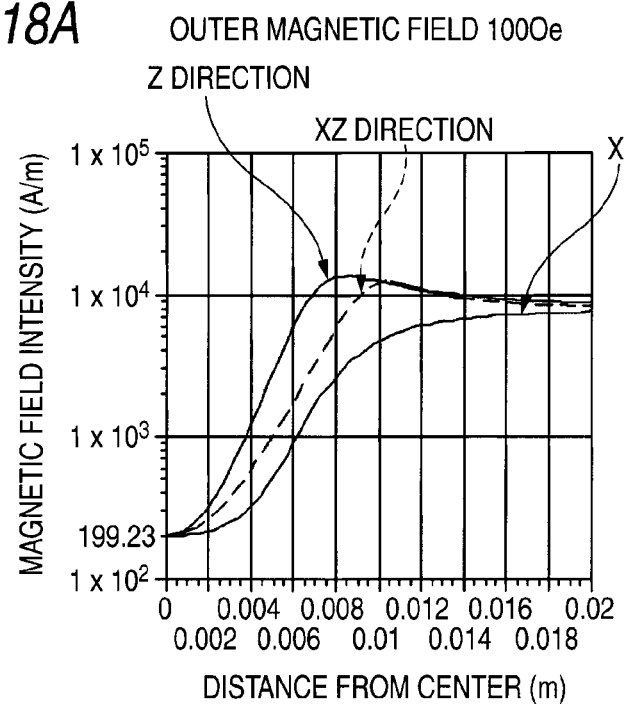
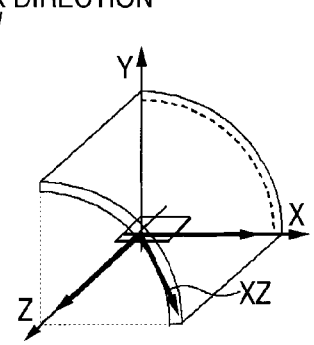
FIG. 18B  OUTER MAGNETIC FIELD 300Oe
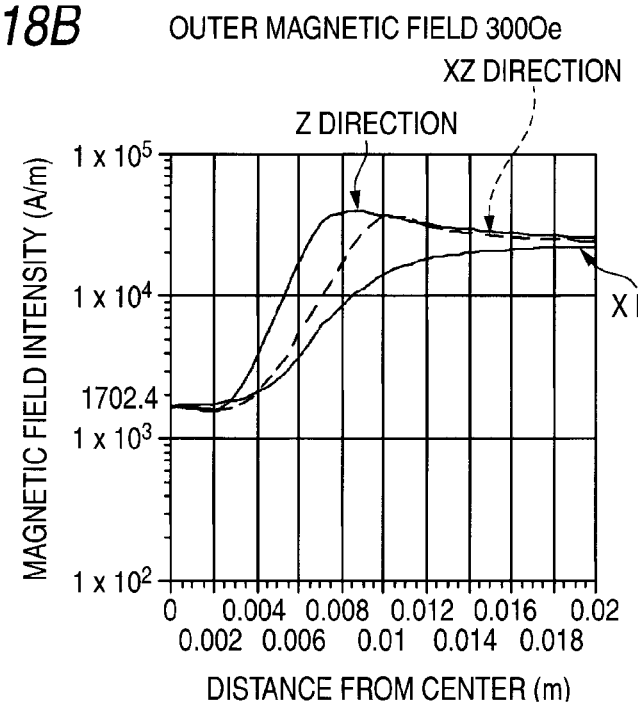

MODEL 2
LEAK MAGNETIC FIELD FROM
CIRCULAR MAGNETIC SHIELD PLATE

MRAM MEMORY CELL

EQUIVALENT CIRCUIT
DIAGRAM OF MRAM

MAGNETIC FIELD RESPONSIVENESS AT TIME OF WRITING IN MRAM

READOUT OPERATION OF MRAM

INFORMATION (1 AND 0) IS IDENTIFIED ACCORDING TO THIS DIFFERENCE

GENERATION OF MAGNETIC POLES

SHIELDING EFFECT

S = Hi / Ho
(Ho: OUTER MAGNETIC FIELD)
(Hi: INNER MAGNETIC FIELD)

PLANAR SHAPE OF MAGNETIC SHIELD
PLATE AND MAGNETIC LINES OF FORCE

MAGNETIC SHIELD MEMBER, MAGNETIC SHIELD STRUCTURE, AND MAGNETIC MEMORY DEVICE

RELATED APPLICATION DATA

The present application claims priority to Japanese Application(s) No(s). P2004-045859 filed Feb. 23, 2004, which application(s) is/are incorporated herein by reference to the extent permitted by law.

BACKGROUND OF THE INVENTION

1. Field of the Invention

The present invention relates to a magnetic shield member serving as means for preventing intrusion of an outer magnetic field and a magnetic shield structure and a magnetic memory apparatus using this magnetic shield member.

2. Description of the Related Art

In recent years, in an increasingly worsening electromagnetic environment, since magnetic failures also increases in the field of a static magnetic field, there is a demand for a high-performance, simple, and inexpensive magnetic shield method.

For the purpose of protecting electronic devices from a leak magnetic field from a superconductive applied device or preventing an electron beam from deflecting due to a magnetic field in a device using the electron beam, sufficient magnetic shield is important. In particular, in the field of magnetic recording, the magnetic shield is attached more importance. It is impossible to use a magnetic head for audio, in which a high permeability material such as Permalloy is used, without the magnetic shield. Moreover, in accordance with the spread of magnetic recording media such as magnetic recording disks like a flexible disk and a hard disk and magnetic recording cards such as a cash card and a credit card, the magnetic shield is required for the purpose of protection of information from an outer magnetic field.

A memory attracting attentions as a high-speed, large capacity (highly integrated), low power consumption, and small nonvolatile memory is a magnetic memory called Magnetic Random Access Memory (MRAM), which is described in, for example, Wang et al., IEEE Trans. Magn. 33 (1997), 4498. This memory is attracting attentions due to the improvement in characteristics of Tunnel Magnetoresistance (TRM) materials in recent years.

The MRAM is a semiconductor magnetic memory utilizing a magnetoresistance effect based on a spin dependent conduction phenomenon peculiar to a nano-magnetic substance and is a nonvolatile memory that can keep memory without the supply of electric power from the outside. Due to its simple structure, it is easy to highly integrate the MRAM. In addition, the MRAM has a large number of rewritable times because recording is performed by rotation of a magnetic moment. Further, concerning an access time, it is expected that the MRAM operates at an extremely high speed. It has already been reported in R. Scheuerlein et al., ISSCC Digest of Technical Papers, pp. 128-129, February 2000 that the MRAM is capable of operating at 100 MHz.

To explain such an MRAM more in detail, as schematically shown in FIG. 20, a TMR element 10 serving as a memory element of a memory cell of the MRAM is a memory element consisting of a structure obtained by stacking a magnetization fixed layer 26 with a direction of magnetization fixed and a storage layer 2, in which magnetization rotates relatively easily, via a tunnel barrier layer 3.

A ferromagnetic substance consisting of nickel, iron, or cobalt or an alloy of these metals is used for the storage layer 2 and the magnetization fixed layer 26. The tunnel barrier layer 3 consists of an insulator such as an oxide or a nitride of aluminum, magnesium, silicon, or the like. The tunnel barrier layer 3 plays roles for cutting magnetic coupling of the storage layer 2 and the magnetization fixed layer 26 and feeding a tunnel current.

Although not shown in the figure, the magnetization fixed layer 26 has a first magnetization fixed layer and a second magnetization fixed layer. A conductive layer of ruthenium, copper, chrome, gold, or silver, to which these magnetization fixed layers couple ferromagnetically, may be sandwiched between both the magnetization fixed layers. In addition, the second magnetization fixed layer is in contact with an antiferromagnetic substance layer of a manganese alloy of iron, nickel, platinum, iridium, or rhodium, a cobalt oxide, or a nickel oxide. Thus, the second magnetization fixed layer has a strong magnetic anisotropy in one direction due to an exchange interaction that acts between these layers.

In the memory cell, an n-type field effect transistor for readout 19 consisting of a gate insulation film 15, a gate electrode 16, a source region 17, and a drain region 18, which is formed, for example, in a p-type well region formed in a p-type silicon semiconductor substrate 13, is arranged. A word line for writing 12, a TMR element 10, and a bit line 11 are arranged above the n-type field effect transistor for readout 19. The TMR element 10 is connected to the bit line 11 via an uppermost conductive layer. The word line 12 is provided below the TMR element 10 via an insulating layer. A sense line 21 is connected to the source region 17 via the source electrode 20. The field effect transistor 19 functions as a switching element for readout. A wiring for readout 22, which is drawn out from a space between the word line 12 and the TMR element 10, is connected to the drain region 18 via a drain electrode 23. Note that the transistor 19 may be an n-type or p-type field effect transistor. Besides, various kinds of switching elements such as a diode, a bipolar transistor, and a metal semiconductor field effect transistor (MESFET) can be used as the transistor 19.

FIG. 21 shows an equivalent circuit diagram of the MRAM. The MRAM has the bit lines 11 and the word lines for writing 12 that cross each other. At crossing points of these writing lines, the storage elements 10 as well as the field effect transistors 19, which are connected to the storage elements and select an element at the time of readout, and the sense lines 21 are provided. The sense lines 21 are connected to sense amplifiers 23 and detect stored information. Note that reference numeral 24 in the figure denotes bidirectional word line current drive circuits for writing and 25 denotes bit line current drive circuits.

FIG. 22 is an asteroid curve indicating writing conditions for the MRAM. FIG. 22 shows a reversed threshold value in a storage layer magnetization direction according to a magnetic field in a direction of easy axis of magnetization $H_{EA}$ and a magnetic field in a direction of hard axis of magnetization $H_{HA}$ applied to the MRAM. When a corresponding synthetic magnetic field vector is generated outside this asteroid curve, magnetic field reversal is caused. However, a synthetic magnetic field vector inside the asteroid curve never reverses the cell from one side of a current bistable state thereof. In addition, in the cell other than the crossing points of the word lines and the bit lines to which an electric current flows, since magnetic fields, which occur only in the word lines or the bit lines, are applied. Thus, when a magnitude of the magnetic fields is equal to or larger than a one direction reversed magnetic field $H_K$, a direction of magnetization of the cells other than the crossing points are also reversed. Therefore, an arrangement is made such that a selected cell is made selectively writable only when a synthetic magnetic field is in a gray area in the figure.

As described above, in the MRAM, in general, two writing lines of the bit line and the word line are used, whereby asteroid magnetization reversal characteristics is utilized to write information only in a designated memory cell according to reversal of a magnetic spin. Synthetic magnetization in a single storage area depends upon vector synthesis of the magnetic field in a direction of easy axis of magnetization $H_{EA}$ and the magnetic field in a direction of hard axis of magnetization $H_{HA}$ applied to the storage area. A writing current flowing through the bit line applies the magnetic field in a direction of easy axis of magnetization $H_{EA}$ to the cell. A current flowing through the word line applies the magnetic field in a direction of hard axis of magnetization $H_{HA}$ to the cell.

FIG. 23 explains a readout operation of the MRAM. As described above, in writing of information, a magnetic spin of a cell is reversed by synthetic magnetic fields in the crossing points of the bit lines 11 and the word lines 12, which are wired in a matrix shape, and directions of the magnetic spin are recorded as information of "1" and "0". In addition, the readout is performed utilizing a TMR effect that is an application of the magnetic resistance effect. The TMR effect is a phenomenon in which a resistance value changes depending upon a direction of a magnetic spin. "1" and "0" of the information are detected according to a state of a high resistance in which the magnetic spin is anti-parallel and a state of a low resistance in which the magnetic sin is parallel. This readout is performed by feeding a readout current (tunnel current) between the work lines 12 and the bit lines 11 and reading out an output according to a level of the resistance to the sense lines 21 via the field effect transistors for readout 19 described above.

As described above, the MRAM is expected as a high speed and nonvolatile large capacity memory. However, since a magnetic substance is used for keeping a memory, there is a problem in that information is erased or rewritten due to an influence of an outer magnetic field. "0" and "1" are written by rotating a direction of a magnetic spin 180° and are read out according to a difference of resistance caused by the direction of the magnetic spin. However, since a coercive force (Hc) is, for example, about several Oe to 100 Oe, if an internal leak magnetic field due to an outer magnetic field exceeding the coercive force acts, it may be impossible to selectively perform writing in a predetermined memory cell.

Therefore, as a step for putting the MRAM to practical use, establishment of measures against an outer magnetic field, that is, a magnetic shield structure for shielding an element from external electromagnetic waves is desired.

As a shape and a structure of magnetic shield means, in general, a space to be prevented from being affected by magnetic fields are covered and surrounded by a high magnetic permeability material or a high saturation magnetization material. In addition, when a space to be prevented from being affected by magnetic fields is small, it is also possible to sandwich the space with two magnetic shield plates (a sandwich structure).

As a magnetic shield structure of the MRAM, there is a proposal for giving magnetic shield characteristics to the MRAM by using an insulative ferrite (MnZn and NiZn ferrite) layer for a passivation film of an MRAM element (see U.S. Pat. No. 5,902,690 (fifth column and FIGS. 1 and 3)). In addition, there is a proposal for giving a magnetic shield effect to the MRAM by attaching high magnetic permeability magnetic substances such as permalloy above and below a package to prevent intrusion of magnetic fluxes into an internal element (see U.S. Pat. No. 5,939,772 (second column and FIGS. 1 and 2)). Moreover, there is a disclosure about a structure in which an element is covered with a shield lid of a magnetic material such as soft iron (JP-A-2001-250206 (right column on page 5 and FIG. 6)).

In order to prevent intrusion of external magnetic fluxes into the memory cell of the MRAM, it is most important to surround an element with a magnetic material having a high magnetic permeability to provide a magnetic path that prevents magnetic fluxes from intruding into the MRAM. For this purpose, best means is to completely cover the element with a magnetic shield layer, but it is difficult to manufacture an actual shield structure. Thus, a magnetic shield that can be manufactured easily is desired.

Thus, as Japanese Patent Application No. 2002-357806, the applicant has already proposed an MRAM that is simply provided with a magnetic shield layer and can realize a high-performance magnetic shield effect. This will be hereinafter referred to as the invention of the earlier application.

According to this invention of the earlier application, as shown in FIGS. 24A, 24B and 20, in a package in which a magnetic random access memory (MRAM) 30 consisting of a memory element formed by stacking the magnetization fixed layer 26 with a direction of magnetization fixed and the magnetic layer 2, in which a direction of magnetization can be changed, via the tunnel barrier layer 3 as described above is sealed by a sealing material 32 such as resin, magnetic shield layers (magnetic shield plates) 52A and 52B having a rectangular parallelepiped shape as a planar shape for magnetically shielding the MRAM 30 are provided in contact with one outer surface and/or the other outer surface of the sealing material 32 (or on at least one side of the sealing material 32 in the inside thereof in a non-contact state with the MRAM 30). Note that, in the figure, reference numeral 41 denotes a die pad for fixing the MRAM 30 and 31 denotes an external lead. However, for example, wire bonding for connecting the MRAM 30 and the external lead 31 is not shown in the figure.

Therefore, according to the magnetic memory device of the invention of the earlier application, taking notice of the fact that the MRAM 30 is mainly used as the package molded by the sealing material 32 such as resin, the magnetic shield layers 52A and 52B are pasted to one outer surface (e.g., an upper surface of the package on a chip surface side of the memory element) or the other surface (e.g., a lower surface of the package on a chip rear surface side of the memory element) of the molded package sealing material 32 substantially in parallel with the MRAM 30 or an outer magnetic field (a magnetic line of force) with an adhesive or the like. This makes it possible to easily attach or detach the magnetic shield layers 52A and 52B, which are processed in a shape effective for magnetic shield, or it is possible to easily embed the magnetic shield layers 52A and 52B in a predetermined position in the sealing material 32 on at least one side of the memory element 30 simply by arranging the magnetic shield layers 52A and 52B in a mold at the time of molding. Therefore, it is possible to easily realize magnetic shield, which is high-performance for the MRAM, and simplify work for mounting the magnetic shield. In addition, this package has a structure and a shape that are also suitable when the package is mounted on a circuit board.

The magnetic shield effect realized by using the magnetic material is easily understood with reference to FIGS. 25A and 25B. FIG. 25A shows a state in which a magnetic substance 51 of a ring shape in section, which has a hollow 50 in the inside, is placed in an outer magnetic field $H_0$. The magnetic substance 51 is affected by the magnetic field and magnetized to have magnetic poles. The magnetic poles generated in the magnetic substance generate a magnetic field in a direction opposite to a direction of the outer magnetic field around the magnetic poles. When this magnetic field in the opposite direction and the magnetic field around the magnetic poles are synthesized, as shown in FIG. 25B, a space in the inside surrounded by the magnetic substance 51 changes to a very small magnetic field space having an inner magnetic field Hi. This means that the magnetic substance 51 has caused the shield effect.

However, with the structure in which mainly a space to be prevented from being affected by a magnetic field is covered and surrounded by the magnetic substance 51 consisting of a high magnetic permeability material or a high saturation magnetization material as described above, the MRAM is not preferably mounted on a device that tends to be reduced in size and weight. In addition, when a space to be prevented from being affected by a magnetic field is small, it is possible to sandwich the space with two magnetic shield plates (a sandwich structure). However, when mounting of the MRAM on a device and weight of the device are taken into account, it is indispensable to form a magnetic shield plate in a shape and a structure that realizes larger shield efficiency with a smaller volume.

In particular, magnetic saturation starts when the outer magnetic field $H_0$ increases in size to be close to a limit of saturation magnetic flux density of the magnetic shield material. The magnetic saturation starts from a part where magnetic lines of force concentrate in the inside of a magnetic shield member and a magnetic permeability decreases. As a result, the magnetic shield effect falls. Consequently, it is also necessary to relax the magnetic saturation in the inside of the magnetic shield member.

It is generally recognized that magnetic lines of force are substantially perpendicular to a high magnetic permeability material in a boundary of the air and the high magnetic permeability material, a density of magnetic lines of force (magnetic flux density) in a magnetic substance increases, and a density of magnetic lines of force in a space surrounded by the magnetic substance decreases. Taking this recognition into account, in the case of a planar magnetic shield plate 52 of a rectangular shape (e.g., a square shape) as shown in FIG. 26, a portion (c), where magnetic lines of force concentrate, is generated in the magnetic substance due to a magnetic field intruding from a facet portion (e) ((e) in FIG. 26) perpendicular to a direction of an outer magnetic field and a facet portion (b) parallel to the magnetic shield plate 52. As a result, magnetic saturation tends to occur and the magnetic shield effect falls.

SUMMARY OF THE INVENTION

The invention has been devised in view of the problems, and it is an object of the invention to relax magnetic saturation with improvement in a shape and a structure of a magnetic shield member and realize magnetic shield that is preferable and high-performance for a magnetic device such as an MRAM.

The invention relates to a magnetic shield member in which, in a planar shape or/and a sectional shape, angles formed by sides on an intrusion side and an emission side of an outer magnetic field and sides adjacent to the sides are obtuse angles, respectively. In addition, the invention relates to a magnetic shield member in which the planar shape or/and the sectional shape is an m-sided polygon (m is an integer satisfying the condition m≧-4) and corners formed by the sides and the adjacent sides assume an outward curved line shape.

The invention provides a magnetic shield in which the planar shape or/and the sectional shape form a continuous surface over an entire area thereof and at least an intrusion side and an emission side of an outer magnetic field of outer peripheral sides thereof form an outward curved line shape.

The invention provides a magnetic shield structure in which at least one of the magnetic shields of the invention is set.

The invention also provides a magnetic memory device that has a magnetic memory unit and has the magnetic shield of the invention opposed to this magnetic memory unit.

Note that, in the invention, the "sides on an intrusion side and an emission side of an outer magnetic field and sides adjacent to the sides" mean sides that are adjacent (or continuous) to sides crossing (in particular, perpendicular to or substantially perpendicular to) an outer magnetic field direction in the intrusion or emission side of the outer magnetic field. These sides form the "angles" or the "corners" described above.

In the invention, in order to realize advantages of the invention surely and sufficiently, the angles formed by the sides and the adjacent sides should be set to an angle exceeding 90° (i.e., obtuse angle), respectively. In particular, it is desirable that this angle is 108° or more and less than 180°. If the angle is less than 108°, concentration of magnetic fields in the magnetic shield member increases. If the angle is 180° or more, concentration of magnetic fields at corners of the magnetic shield member, which is caused by the angle, tends to occur.

In this case, it is preferable that the planar shape or/and the sectional shape in a plane, which is in a direction of the outer magnetic field or parallel (completely parallel or substantially parallel) to the memory unit, is an n-sided polygon (n is an integer satisfying conditions n≧5 and ∞>n≧5).

In addition, when the planar shape or/and the sectional shape is an m-sided polygon, it is preferable that ∞>m≧4, and it is preferable that each of the corners of the outward curved line shape in this m-sided polygon are present between two linear sides. However, it is desirable to set a ratio of a length in the outer magnetic field direction of the corner (in particular, a radius at the corner) r and a length of a linear side adjacent to the corner (in particular, a length in the outer magnetic field direction) L as r/L≧1/4 in the planar shape and r/L≧1/3 in the sectional shape. When this ratio deviates from this range to be small, the corner of the curved line shape becomes too small, and the concentration of magnetic fields in the magnetic shield member tends to increase. In addition, in the sectional shape, it is desirable to set a ratio of a length $D_1$ in a longitudinal direction (a direction substantially parallel to the memory unit) and a length $D_2$ of a short side (a direction substantially perpendicular to the memory unit) as $D_1/D_2 \geq 5$.

When the planar shape or/and the sectional shape form a continuous surface over the entire area thereof and at least an intrusion side and an emission side of an outer magnetic field of an outer periphery of the surface form an outward curved line shape, in particular, it is desirable that the planar shape or/and the sectional shape are circular or elliptical.

It is preferable that the magnetic shield member of the invention (in particular a magnetic shield plate of a tabular shape) has a magnetic shield structure in which at least one magnetic shield member is set substantially in parallel to an outer magnetic field. This may hold true for a case in which the magnetic shield is applied to a magnetic memory device.

However, it is preferable that the magnetic shield is arranged to be opposed to a magnetic memory unit or a magnetic random access memory and substantially in parallel thereto. In particular, since the magnetic shield member of the invention is excellent in a magnetic shield effect regardless of a small size, the magnetic shield member is suitable for the magnetic random access memory. However, the magnetic shield member may be applied to other magnetic devices such as a magnetic memory.

In this case, it is preferable that the magnetic memory unit is constituted as a magnetic random access memory (MRAM) consisting of a memory element, which is formed by stacking a magnetization fixed layer with a direction of magnetization fixed and a magnetic layer, in which a direction of magnetization can be changed, and the magnetic shield member is provided to be opposed to the magnetic random access memory. Further, it is preferable that a pair of the magnetic shield members are set in parallel to each other, and the magnetic memory unit or the magnetic random access memory is arranged between these magnetic shields.

Note that, in the invention, as a shield material for forming the magnetic shield member, there are pure iron, Fe—Ni, Fe—Co, Fe—Ni—Co, Fe—Si, Fe—Al—Si, and ferrite materials. Among them, a material that not only has a certain degree of magnetic permeability but also high saturation magnetization, which is never saturated with respect to an outer magnetic field easily, is desirable. As such a material, a material having saturation magnetization equal to or higher than 1.8 tesla (T), in particular, a soft magnetic material including at least one kind selected out of a group consisting of 2 to 3 weight % of Si and the balance of Fe; 47 to 50 weight % of Co and the balance of Fe; 35 to 40 weight % of Co and the balance of Fe; 23 to 27 weight % of Co and the balance of Fe; 48 to 50 weight % of Co, 1 to 3 weight % of V, and the balance of Fe is desirable.

BRIEF DESCRIPTION OF THE DRAWINGS

In the accompanying drawings:

FIG. 3 is a sectional view of another magnetic shield plate according to the embodiment;

FIG. 8 is a conceptual diagram of the model 1 according to the embodiment;

FIG. 9 is a conceptual diagram showing a unit area for measurement of the model 1 according to the embodiment;

FIGS. 11A and 11B are conceptual diagrams showing a unit area for measurement of the model 2 according to the embodiment;

FIGS. 18A and 18B are graphs showing a leak magnetic field with respect to a distance from a center of the magnetic shield plate of the model 1 according to the embodiment;

DETAILED DESCRIPTION OF THE PREFERRED EMBODIMENT

A preferred embodiment of the invention will be hereinafter described in detail with reference to the accompanying drawings.

FIG. 1 and FIGS. 2A to 2C are diagrams illustrating planar shapes of various kinds of magnetic shield plates 62 according to this embodiment.

Figure 1:
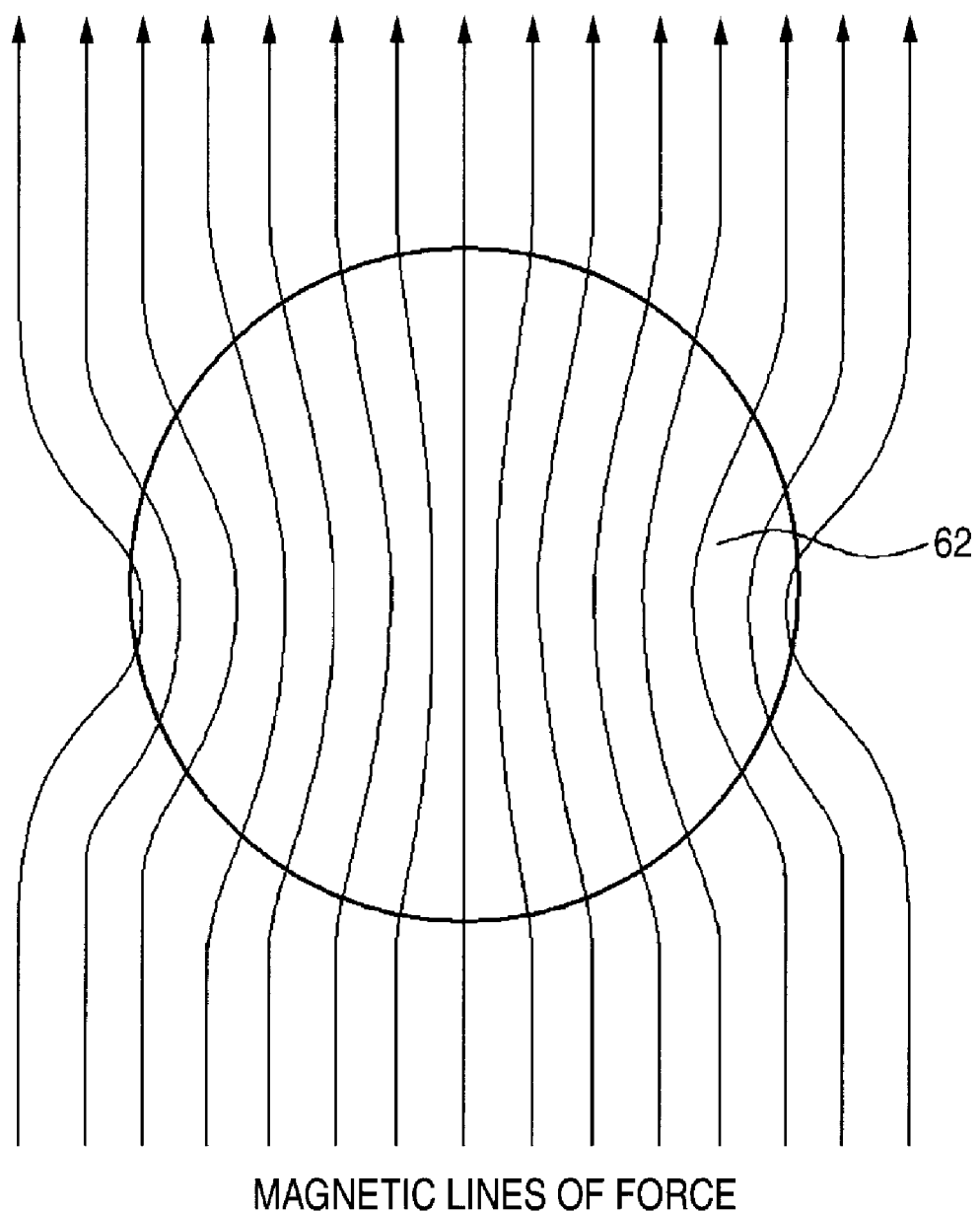
FIG. 1 is a plan view of a magnetic shield plate according to an embodiment of the invention.
Figure 26:
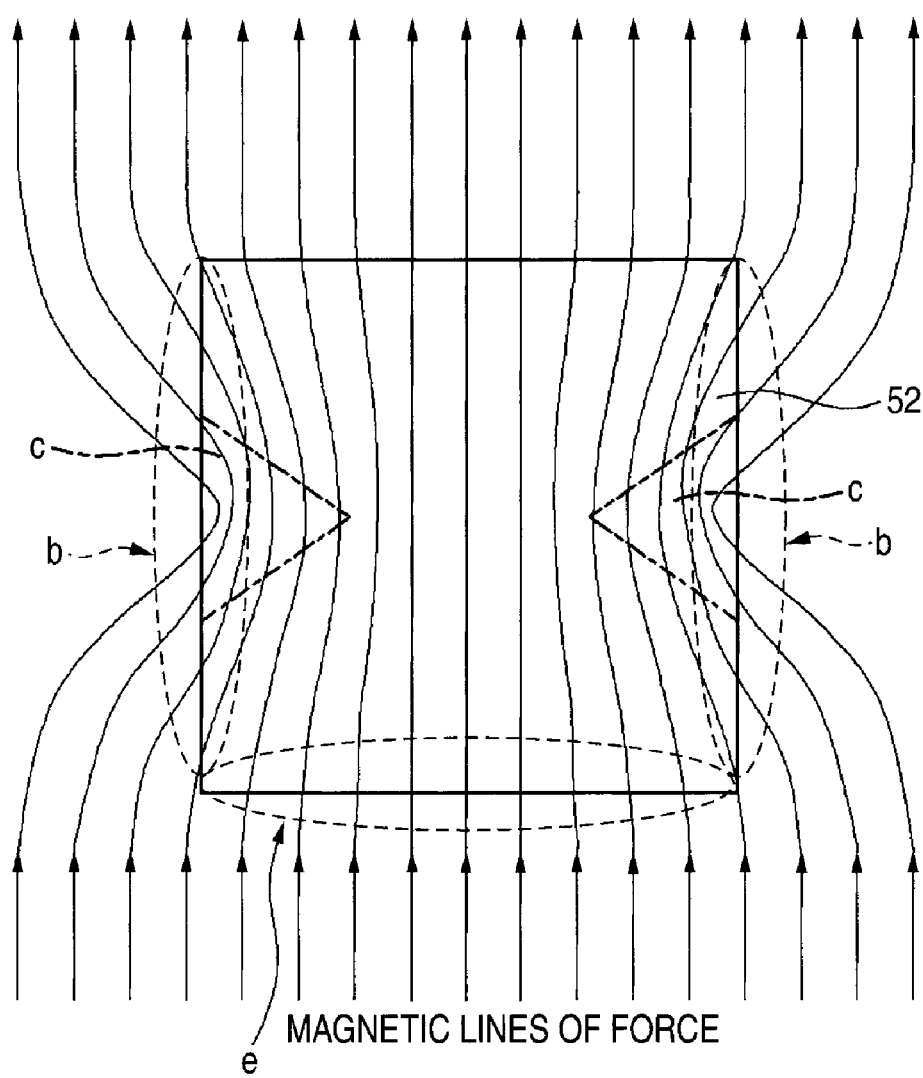
FIG. 26 is a plan view showing a state of magnetic fluxes generated by an outer magnetic field at the time when a conventional magnetic shield plate is used.

FIG. 1 shows a magnetic shield plate of an ideal planar shape for relaxing magnetic saturation in a plane direction of the magnetic shield plate, that is, a circular magnetic shield plate 62. In this circular magnetic shield plate 62, there is almost no facet portion "a" perpendicular to intrusion and emission directions of an outer magnetic field and the facet portion "b" parallel to the directions as shown in FIG. 26. This means that there is no area where the facet portion "a" and the facet portion "b" are orthogonal to each other. Thus, magnetic fields (magnetic lines of force) caused by an outer magnetic field never concentrate in the magnetic shield plate 62. As a result, it is possible to relax the magnetic saturation sufficiently and improve a magnetic shield effect significantly.

Figure 2A:
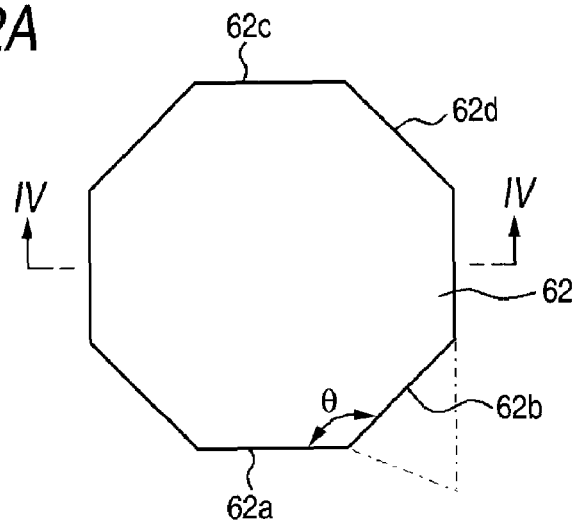
FIGS. 2A to 2C are plan views of other magnetic shield plates according to the embodiment.

FIG. 2A shows the magnetic shield plate 62 of a planar shape of a polygon (an n-sided polygon: $\infty > n \geqq 5$, for example, n=8). As in FIG. 1, when an outer magnetic field intrusion side is set in a lower part of the figure and an outer magnetic field emission side is set in an upper part of the figure, it is assumed that an angle θ formed by a side 62a on the outer magnetic field intrusion side (perpendicular to an outer magnetic field direction) and a side 62b adjacent to the side 62a is an obtuse angle ∞>θ>90°, in particular 180°>θ≧108°, for example, 135°. When this angle is less than 108°, concentration of magnetic fields in the magnetic shield plate 62 increases. When this angle is equal to or larger than 180°, a polygon cannot be formed or a distorted corner like an imaginary line is generated, and the concentration of magnetic fields tends to occur in this corner.

In the magnetic shield plate 62 in FIG. 2A, both the sides 62a and 62b are not orthogonal to each other and largely deviate from an orthogonal state. Thus, it is possible to reduce the concentration of magnetic fields intruding from both the sides. This holds true for both sides 62c and 62d on the outer magnetic field emission side.

Figure 2B:
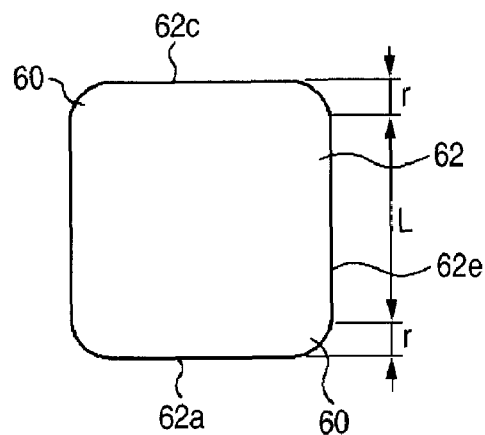

FIG. 2B shows the magnetic shield plate 62 of a sectional shape of a polygon (an m-sided polygon: ∞>m≧4, for example, m=4). A corner 60 formed by the side 62a on the outer magnetic field intrusion side (perpendicular to the outer magnetic field direction) and a side 62e adjacent to the side 62a are rounded in an outward arc shape (radiused). Consequently, the side 62a and a side of the corner 60 are not orthogonal to each other and largely deviate from an orthogonal state. Thus, as shown in FIG. 1, it is possible to reduce the concentration of intruding magnetic fields. This holds true for the outer magnetic field emission side.

It is preferable that the corner 60 of the outward arc shape is present between both the linear sides 62a and 62e. However, it is desirable to set a ratio of a length in the outer magnetic field direction of this corner (a radius of the corner) r and a length of the linear side 62e adjacent to the corner (a length in the outer magnetic field direction) L as r/L≧1/4. When this ratio deviates from this range to be small, the corner 60 of the arc shape becomes too small, and the concentration of magnetic fields in the magnetic shield tends to increase.

Figure 2C:
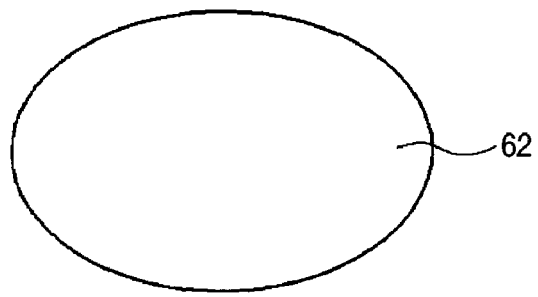

FIG. 2C shows the magnetic shield plate 62 of an elliptical planar shape. This is excellent in an action for relaxing magnetic saturation like the circular magnetic shield plate shown in FIG. 1 and has a satisfactory magnetic shield effect.

FIG. 3 shows a magnetic shield plate 72 of an ideal sectional shape, that is, a circular shape in section for relaxing magnetic saturation in a thickness direction taking into account the fact that outer magnetic fields intrude and are emitted in a thickness (sectional) direction of a magnetic shield plate. In this magnetic shield plate 72 of a circular shape in section, there is almost no facet portion perpendicular to intrusion and emission directions of an outer magnetic field and the facet portion parallel to the directions. This means that there is no area where the facet portions are orthogonal to each other. Thus, magnetic fields (magnetic lines of force) caused by an outer magnetic field never concentrate in the magnetic shield plate 72. As a result, it is possible to relax the magnetic saturation sufficiently and improve a magnetic shield effect significantly.

Figure 4A:
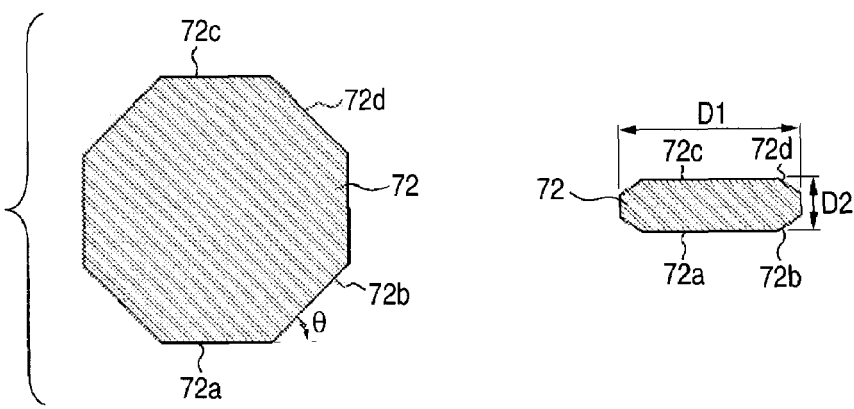
FIGS. 4A to 4C are sectional views of other magnetic shield plates according to the embodiment.

FIG. 4A shows the magnetic shield plate 72 of a polygonal sectional shape of a polygon (an n-sided polygon: ∞>n≧5, for example, n=8). As in FIG. 3, when an outer magnetic field intrusion side is set in a lower part of the figure and an outer magnetic field emission side is set in an upper part of the figure, it is assumed that an angle θ formed by a side 72a on the outer magnetic field intrusion side (perpendicular to an outer magnetic field direction) and a side 72b adjacent to the side 72a is an obtuse angle ∞>θ>90°, in particular 180°>θ>108°, for example, 135°. When this angle is less than 108°, concentration of magnetic fields in the magnetic shield plate 72 increases. When this angle is equal to or larger than 180°, a polygon cannot be formed or the same distorted corner as the one indicated by the imaginary line in FIG. 2A is generated, and the concentration of magnetic fields tends to occur in this corner.

In the magnetic shield plate 72 in FIG. 4A, both the sides 72a and 72b are not orthogonal to each other and largely deviate from an orthogonal state. Thus, it is possible to reduce the concentration of magnetic fields intruding from both the sides. This holds true for both sides 72c and 72d on the outer magnetic field emission side.

However, as shown in the right side in FIG. 4A, actually, in the sectional shape of the magnetic shield plate 72, it is desirable to set a ratio of a length $D_1$ in a longitudinal direction (a direction substantially parallel to a memory unit to be described later or a horizontal direction in the figure) and a length $D_2$ of a short side (a direction substantially perpendicular to the memory unit) as $D_1/D_2 \geq 5$ (the same holds true in the following description). This section is equivalent to a cross section along line IV-IV in FIG. 2A (the same holds true in the following description).

Figure 4B:
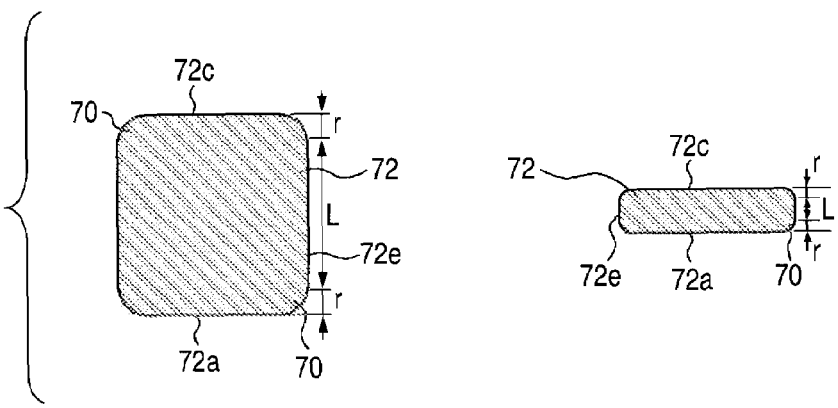

FIG. 4B shows the magnetic shield plate 72 of a sectional shape of a polygon (an m-sided polygon: ∞>m≧4, for example, m=4). A corner 70 formed by the side 72a on the outer magnetic field intrusion side (perpendicular to the outer magnetic field direction) and a side 72e adjacent to the side 72a are rounded in an outward arc shape (radiused). Consequently, the side 72a and a side of the corner 70 are not orthogonal to each other and largely deviate from an orthogonal state. Thus, as shown in FIG. 3, it is possible to reduce the concentration of intruding magnetic fields. This holds true for the outer magnetic field emission side.

It is preferable that the corner 70 of the outward arc shape is present between both the linear sides 72a and 72e. However, it is desirable to set a ratio of a length in the outer magnetic field direction of this corner (a radius of the corner) r and a length of the linear side 72e adjacent to the corner (a length in the outer magnetic field direction) L as r/L≧1/3. When this ratio deviates from this range to be small, the corner 70 of the arc shape becomes too small, and the concentration of magnetic fields in the magnetic shield tends to increase.

Figure 4C:
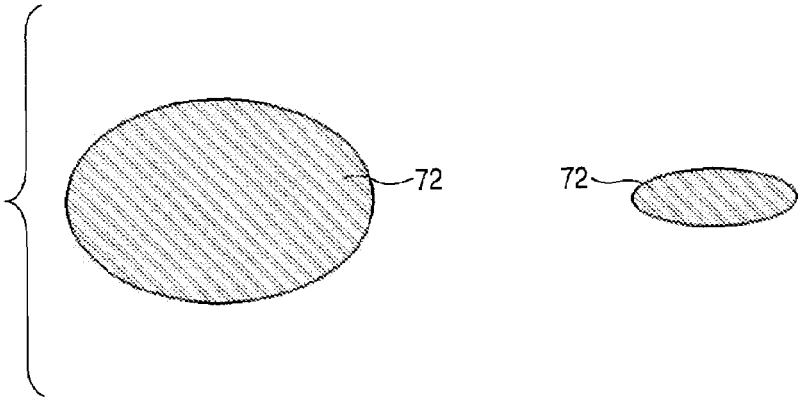

FIG. 4C shows the magnetic shield plate 72 of an elliptical planar shape. This is excellent in an action for relaxing magnetic saturation like the magnetic shield plate circular in section shown in FIG. 3 and has a satisfactory magnetic shield effect.

Figure 5A:
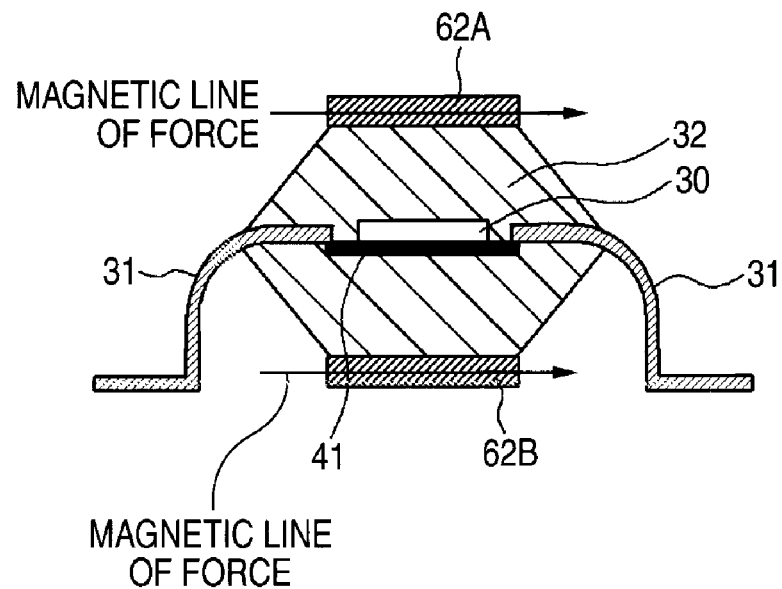
FIG. 5A is a schematic sectional view of an MRAM package having the magnetic shield plate according to the invention.
Figure 5B:
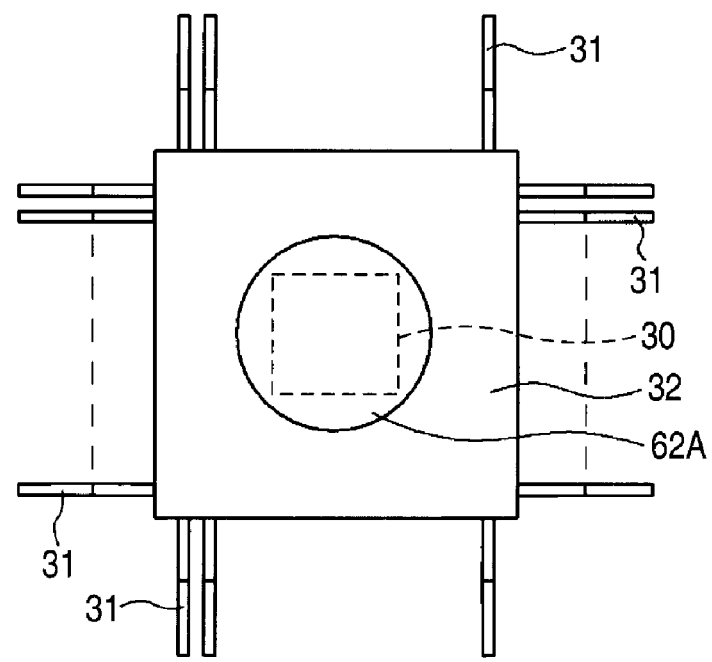
FIG. 5B is a plan view of the MRAM package.
Figure 24A:
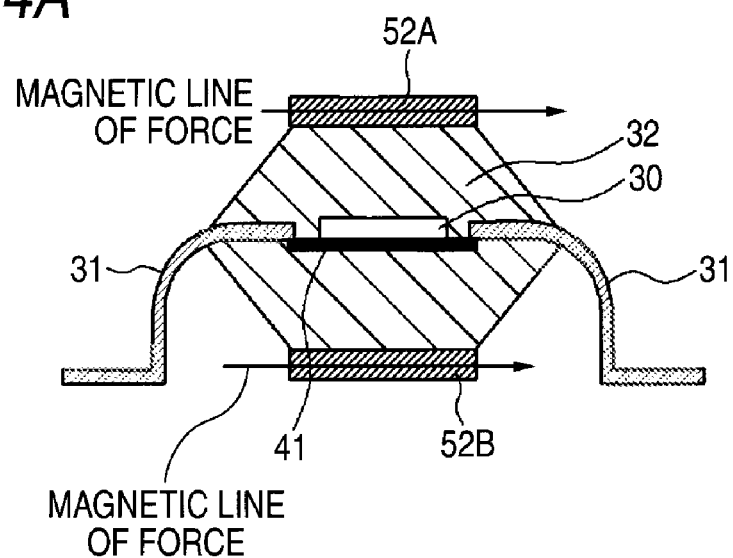
FIG. 24A is a schematic sectional view of an MRAM package according to an invention of an earlier application.
Figure 24B:
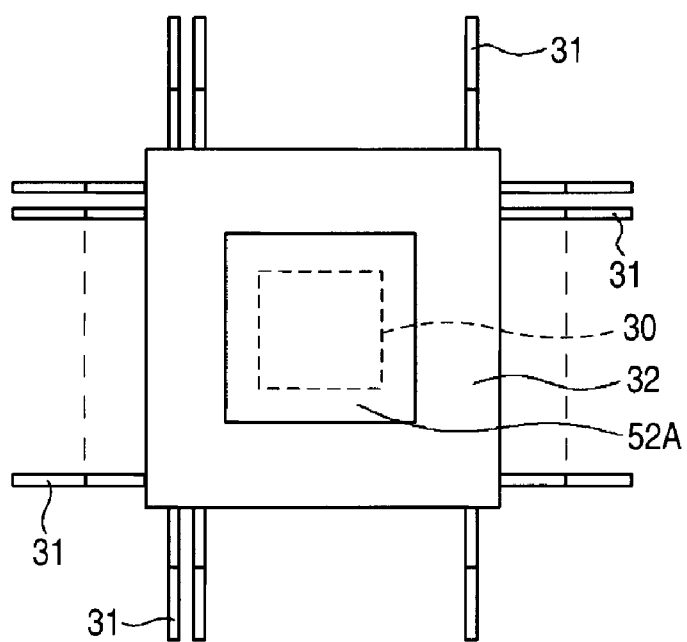
FIG. 24B is a plan view of the MRAM package.
Figure 25A:
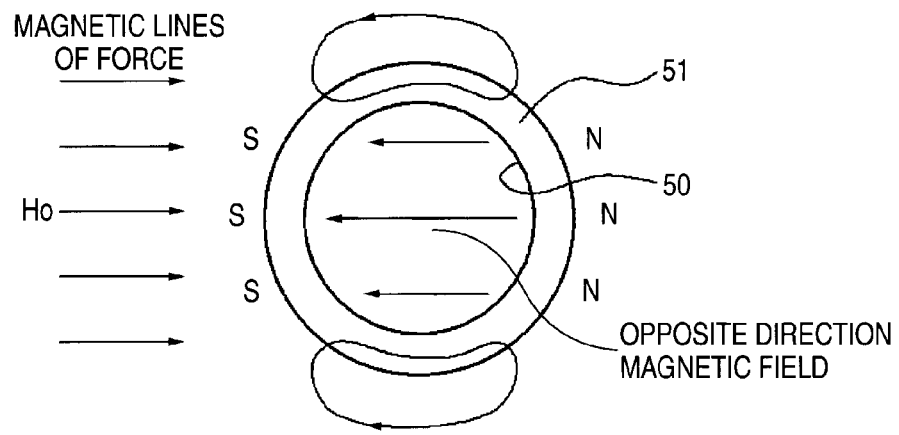
FIGS. 25A and 25B are conceptual diagrams for explaining generation of magnetic poles at the time of magnetic shield and an outer magnetic field shield effect.
Figure 25B:
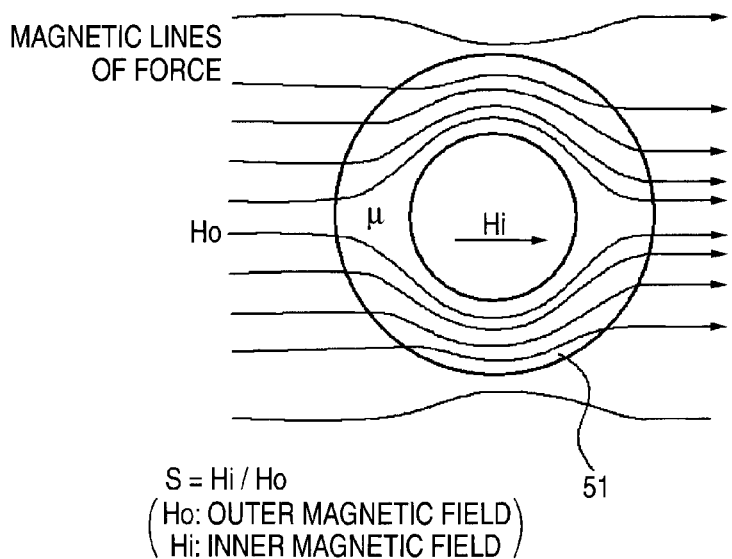

FIG. 5 shows a package in which a magnetic random access memory (MRAM) 30 consisting of a memory element formed by stacking the magnetization fixed layer 26 with a direction of magnetization fixed and the magnetic layer 2, in which a direction of magnetization can be changed, via the tunnel barrier layer 3 as shown in FIG. 24 is sealed by a sealing material 32 such as resin. Magnetic shield layers for magnetically shielding the MRAM 30, for example, magnetic shield plates 62A and 62B having a circular planar shape are provided in contact with one outer surface and/or the other outer surface of the sealing material 32 (or on at least one side of the sealing material 32 in the inside thereof in a non-contact state with the MRAM 30). Note that, in the figure, reference numeral 41 denotes a die pad for fixing the MRAM 30 and 31 denotes an external lead. However, for example, wire bonding for connecting the MRAM 30 and the external lead 31 is not shown in the figure.

This magnetic memory device incorporates the MRAM 30 susceptible to an influence of an outer magnetic field. However, for example, the pair of magnetic shield plates 62A and 62B, which are provided on the sealing material 32 so as to sandwich the MRAM 30 form both sides thereof, have a circular planar shape shown in FIG. 1. Thus, even if an outer magnetic field substantially parallel to the MRAM 30 intrudes into the magnetic shield plates 62A and 62B arranged substantially in parallel to the MRAM 30, the magnetic shield plates 62A and 62B are not magnetically saturated easily and can sufficiently hold a magnetic shield effect to improve performance, in particular, writing characteristics of the MRAM 30 regardless of a small size thereof.

In this magnetic memory device, as in the invention of the earlier application described above, taking notice of the fact that the MRAM 30 is mainly used as the package molded by the sealing material 32 such as resin, the magnetic shield plates 62A and 62B are pasted to one outer surface (e.g., an upper surface of the package on a chip surface side of the memory element) or the other surface (e.g., a lower surface of the package on a chip rear surface side of the memory element) of the molded package sealing material 32 substantially in parallel with the MRAM 30 or an outer magnetic field (a magnetic line of force) with an adhesive or the like. This makes it possible to easily attach or detach the magnetic shield plates 62A and 62B, which are processed in a shape effective for magnetic shield, or it is possible to easily embed the magnetic shield plates 62A and 62B in a predetermined position in the sealing material 32 on at least one side of the memory element 30 simply by arranging the magnetic shield plates 62A and 62B in a mold at the time of molding. Therefore, it is possible to easily realize a magnetic shield, which is high-performance for the MRAM, and simplify work for mounting the magnetic shield. In addition, this package has a structure and a shape that are also suitable when the package is mounted on a circuit board.

In order to confirm a relaxation phenomenon of magnetic saturation of the magnetic shield plate of the shape and the structure described above, a magnetic shield effect was analyzed by simulation using the magnetic shield plate.

The publicly known ANSYS was used as a simulator, and a shield structure consisting of two square magnetic shield plates and a shield structure consisting of two circular magnetic shield plates were analyzed to compare both the shield structures. Note that the ANSYS is a simulation program that was developed by Dr. John A. Swanson and satisfies requirements of all finite element methods such as electrical, thermal, and structure analyses. A wide range of analysis functions are prepared for a linear/nonlinear structural analysis, a steady/non-steady heat conduction analysis, a thermal fluid analysis, an electromagnetic field analysis, a piezoelectric analysis, an acoustic analysis, and a shock/fall problem. Extensive analysis functions of the ANSYS and, in particular, a flexible composite analysis function called multi-physics satisfy needs of a wide range of users. The ANSYS has grown into a CEA program that is rated most highly all over the world. (http://www.cybernet.co.jp/ansys/information/ansys.html).

Figure 6:
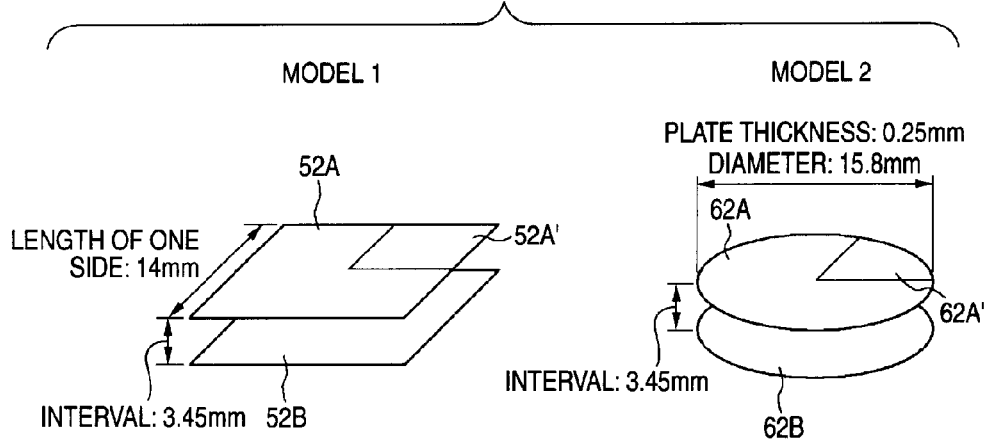
FIG. 6 is a perspective view of magnetic shield plates of a model 1 and a model 2 that are used for analysis of a magnetic shield effect according to the embodiment.

FIG. 6 shows the magnetic shield structures used for the analysis. A size of the conventional square magnetic shield plates 52A and 52B was set to 14×14×0.25 mm and an interval between the two magnetic shield plates 52A ad 52B was set to 3.45 mm. In addition, a size of the circular magnetic shield plates 62A and 62B based on the invention was set to φ15.8×0.25 mm and an interval between the two magnetic shield plates 62A and 62B was set to 3.45 mm. Note that volumes of the square shield (model 1) and the circular shield (model 2) were equal and magnetic intensities to be applied to the shields as outer magnetic fields were set to 7957.75 A/m (100 Oe) and 23873.24 A/m (300 Oe), respectively.

Figure 7:
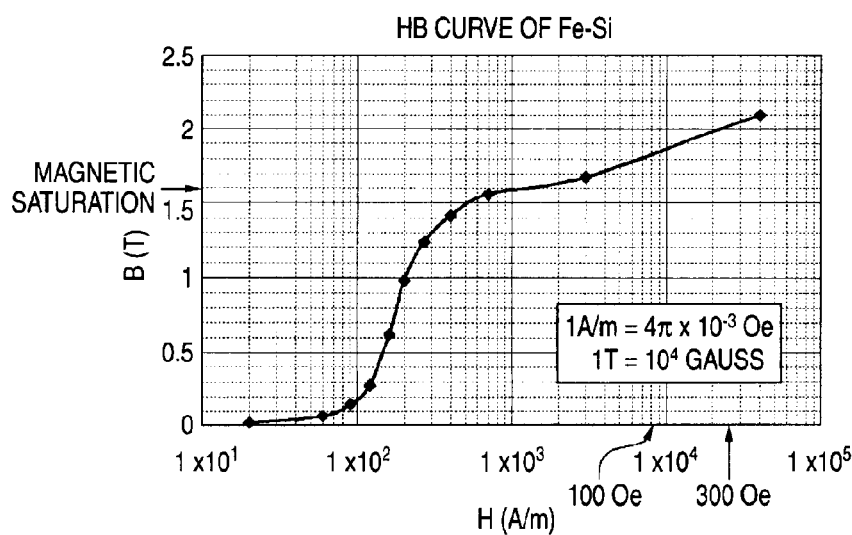
FIG. 7 is a graph showing material characteristics of the magnetic shield plate according to the embodiment.

The magnetic shield plates used in the analysis were made of an Fe—Si material. Material characteristics thereof are shown in FIG. 7. FIG. 7 shows a relation of a magnetic flux density with respect to an applied magnetic field (HB curve).

Figure 10:
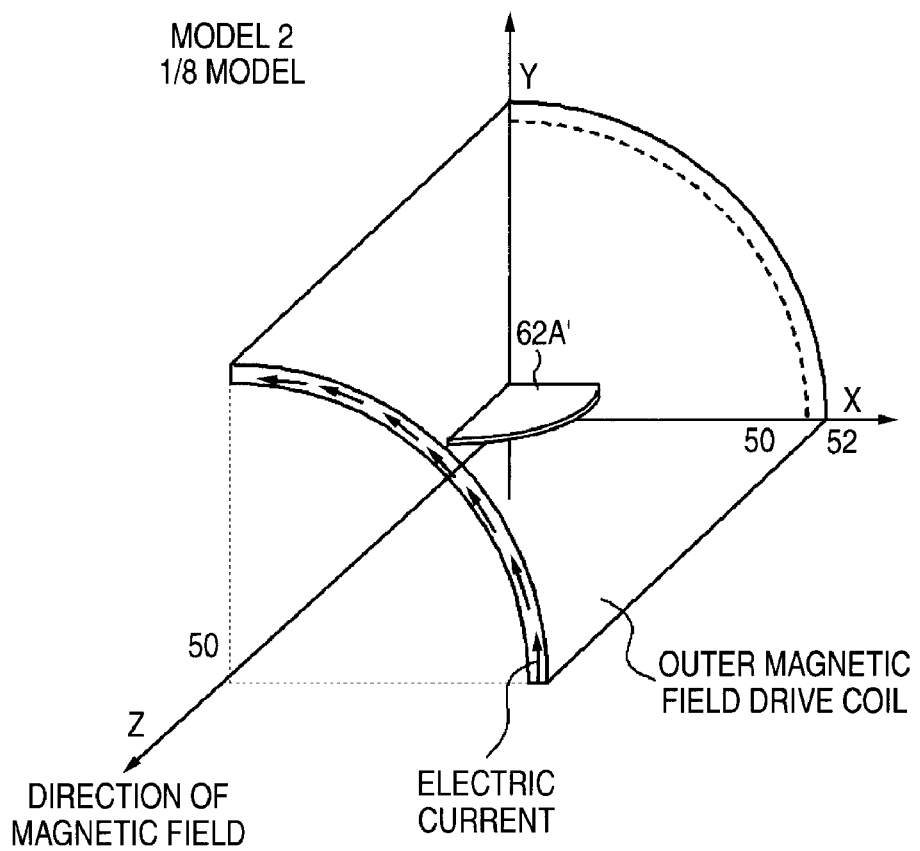
FIG. 10 is a conceptual diagram of the model 2 according to the embodiment.

FIG. 8, FIGS. 9A and 9B, FIG. 10, and FIGS. 11A and 11B show analysis models of ⅛ of a square shield and a circular shield (unit areas 52A' and 62A' for measurement shown in FIG. 6), respectively. It is possible to perform analysis with a ⅛ model when an analysis boundary is set as an object condition. FIGS. 8 and 10 show conceptual diagrams of the square shield and the circular shield, respectively. Outer magnetic field drive coils as shown in the figure are created as models and magnetic fields generated by feeding an electric current to the coils are applied as outer magnetic fields. FIGS. 9A, 9B, 11A, and 11B show fine sections, which are obtained by analyzing the square shield and the circular shield, respectively, in a state of meshes. FIGS. 9A and 11A show overall images and FIGS. 9B and 11B show the parts of magnetic shield plates in enlargement and also show positions of the magnetic shield plates 52A' and 62A'.

FIGS. 12A and 12B and FIGS. 13A and 13B show analysis results in a sectional direction (FIGS. 12A and 13A) and a planar direction (FIGS. 12B and 13B) of the square magnetic shield plate 52A' (model 1) in the cases in which magnetic fields of 7957.75 A/m (100 Oe) and 23873.24 A/m (300 Oe) are applied to the square magnetic shield plate 52A', respectively. FIGS. 12A and 13A and FIGS. 12B and 13B show analysis results on space surfaces around magnetic shield plates obtained by viewing cross sections and planes of the magnetic shield plates two-dimensionally, respectively. Applied magnetic field directions are indicated by arrows, and directions of magnetic fields around the magnetic shield plates according to respective magnetic field intensities [A/m] are indicated by small arrows.

Figure 12A:
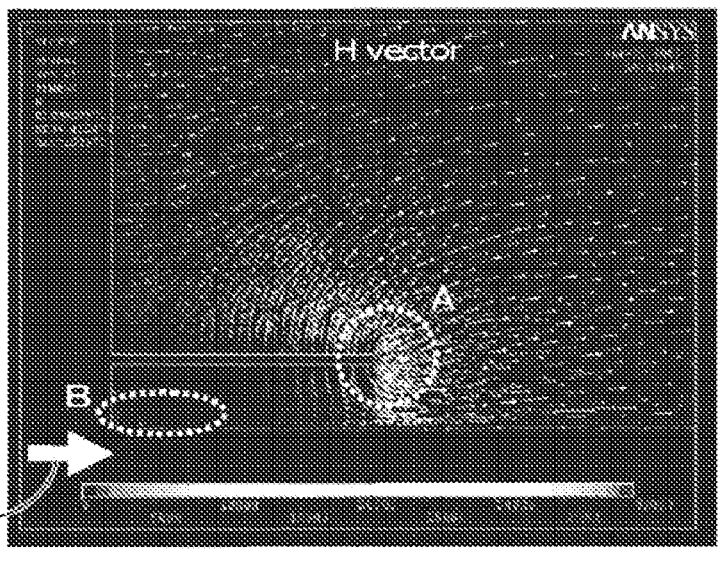
FIGS. 12A and 12B are analytical diagrams at the time of outer magnetic field application of the model 1 according to the embodiment.
Figure 12B:
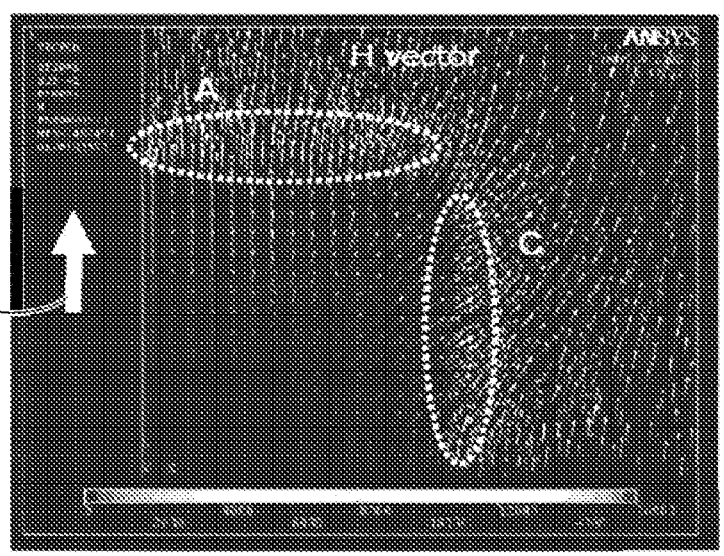
Figure 13A:
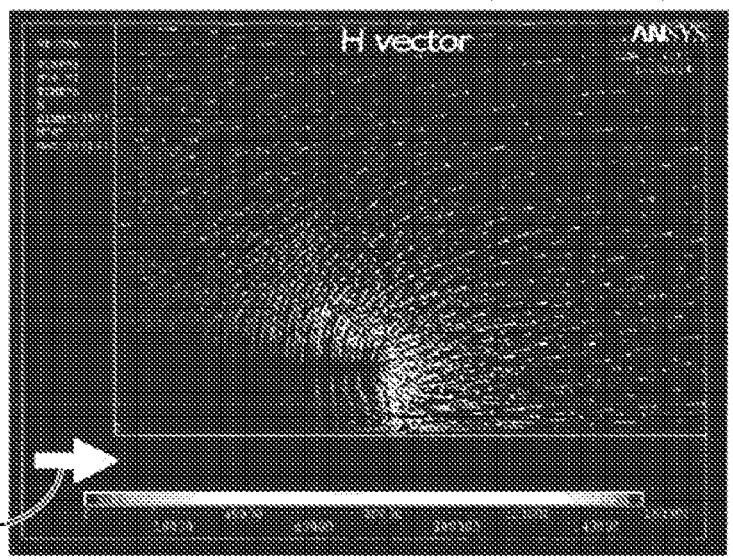
FIGS. 13A and 13B are analytical diagrams at the time of outer magnetic field application of the model 1 according to the embodiment.
Figure 13B:
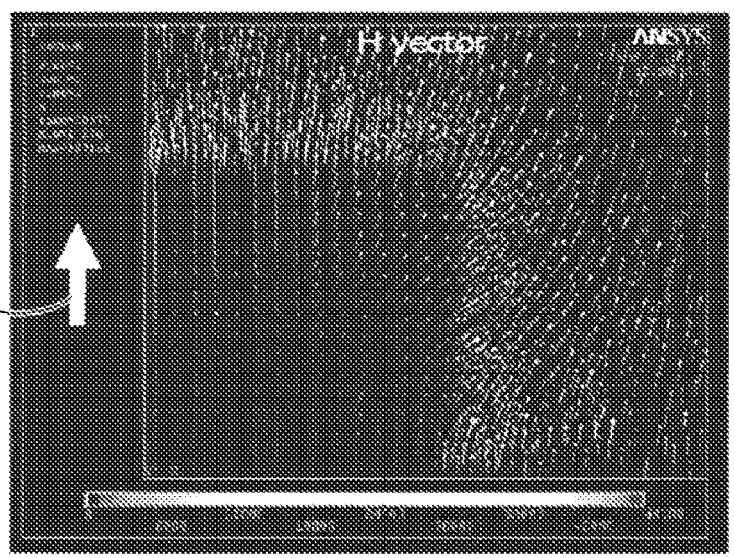

It is seen from FIGS. 12A, 12B, 13A, and 13B that magnetic fields concentrate around the magnetic shield plates (in this model 1, magnetic fields emitted from the magnetic shield plates are shown, and this magnetic field concentration state is the same in other unit areas affected by intruding magnetic fields into the magnetic shield plates: the same holds true in the following description) and, in particular, a magnetic field intensity in an facet portion perpendicular to an outer magnetic field direction indicated by A in FIG. 12A is large. On the other hand, a magnetic field intensity value on an inner side of the magnetic shield plates (in the figure, below the magnetic shield plate) indicated by B in FIG. 12A (B is also in FIG. 13A, although not shown in the figure) takes a small value. From this result, it is seen that outer magnetic fields are collected by the magnetic shield plates and shield leakage of outer magnetic fields to an inner space sandwiched by the two magnetic shield plates. It is also seen from the plane analysis result shown in FIG. 12B that the outer magnetic fields are also emitted to the outside of the magnetic shield plates (or intrude into the magnetic shield plates) from a facet portion parallel to an outer magnetic field direction indicated by C in FIG. 12B (C is also in FIG. 13B, although not shown in the figure) and, in particular, concentrate on a corner on a lower right side in the figure.

Figure 14A:
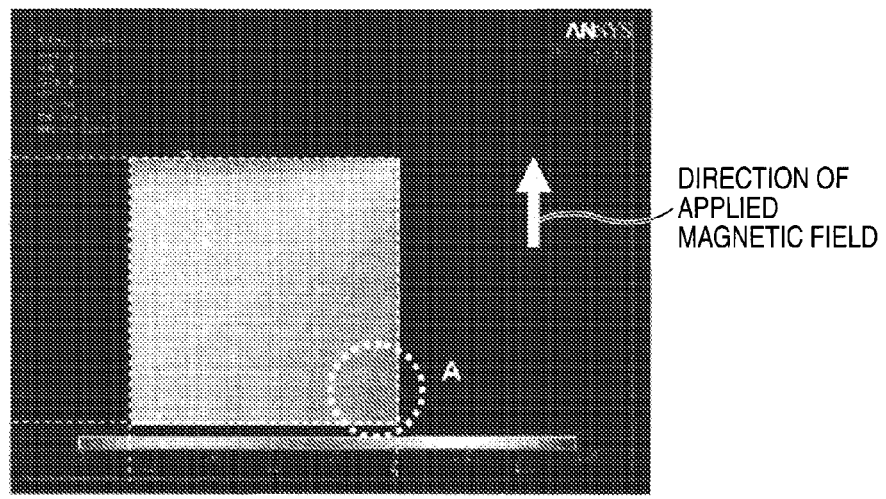
FIGS. 14A and 14B are analytical diagrams showing a magnetization intensity in the magnetic shield plate of the model 1 according to the embodiment.
Figure 14B:
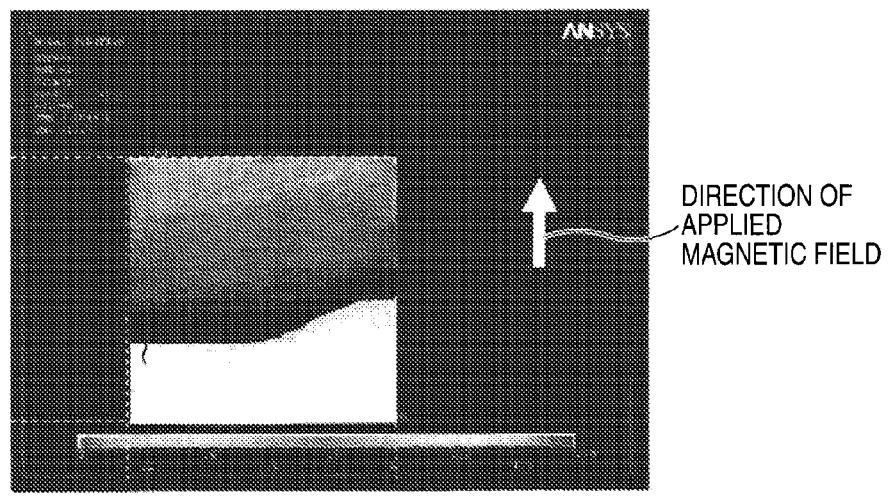

FIGS. 14A and 14B show plane analysis results of magnetization states inside the magnetic shield plates in the model 1. An outer magnetic field direction is indicated by an arrow. An area indicated by light and shade indicates a magnetic flux density [T] inside the respective magnetic shield plates. It is indicated that the magnetic flux density is larger in a darker area and the magnetic flux density becomes smaller toward a lighter area (the same holds true in the following description). Note that a whitish part shown in FIG. 14B indicates that the magnetic flux density is 1.6 T or more, that is, magnetization saturation of the magnetic shield plates occurs (i.e., the magnetic flux density has reached a saturated magnetic flux density).

It is seen from FIGS. 14A and 14B that, in the model 1, the magnetic shield plates start to be saturated from a center portion of a facet parallel to the outer magnetic field direction (A in FIG. 14A) as the outer magnetic field increases in size. Compared with a result according to FIG. 12B, this portion is equivalent to a portion where a magnetic field emitted from (or intruding into) a facet portion perpendicular to the outer magnetic field direction and a magnetic field emitted from (or intruding into) a facet portion parallel to the outer magnetic field direction overlap in a largest area (a portion where magnetic fluxes are densest). When a magnetic field of 23873.24 A/m (300 Oe) is applied, as shown in FIG. 14B, magnetic saturation occurs in the square magnetic shield plate. In this way, it is seen that a magnetic saturation process progresses from the center portion of the facet parallel to the outer magnetic field direction toward the center of the magnetic shield plates.

FIGS. 15A and 15B and FIGS. 16A and 16B show analysis results in the sectional direction (A) and the planar direction (B) of the circular magnetic shield plate 62A' (model 2) in the cases in which magnetic fields of 7957.75 A/m (100 Oe) and 23873.24 A/m (300 Oe) are applied to the magnetic shield plate 62A', respectively. FIGS. 15A and 16A and FIGS. 15B and 16B show analysis results on space surfaces around magnetic shield plates obtained by viewing cross sections and planes of the magnetic shield plates two-dimensionally, respectively. Applied magnetic field directions are indicated by arrows, and directions of magnetic fields around the magnetic shield plates according to respective magnetic field intensities [A/m] are indicated by small arrows.

Figure 15A:
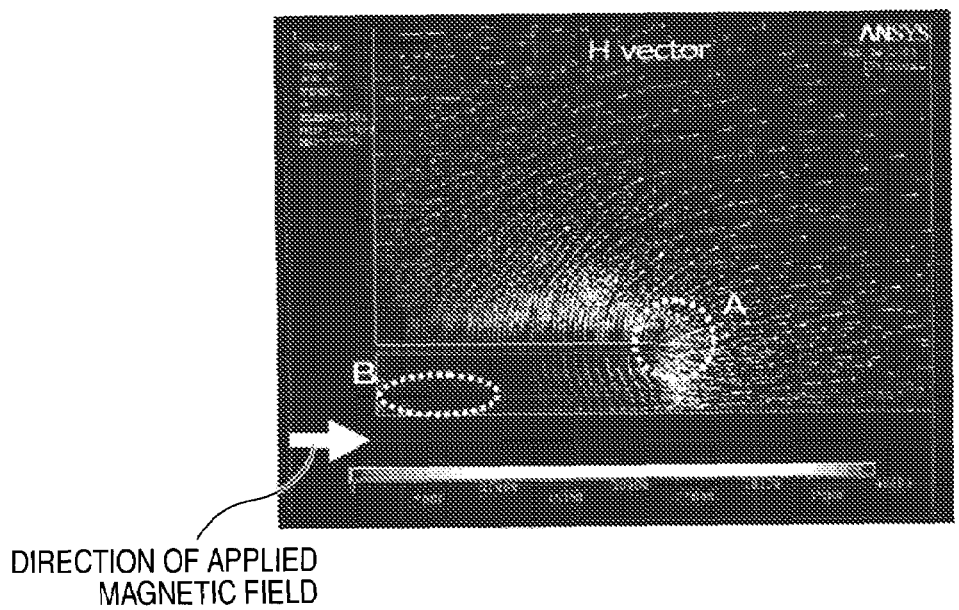
FIGS. 15A and 15B are analytical diagrams at the time of outer magnetic field application of the model 2 according to the embodiment.
Figure 15B:
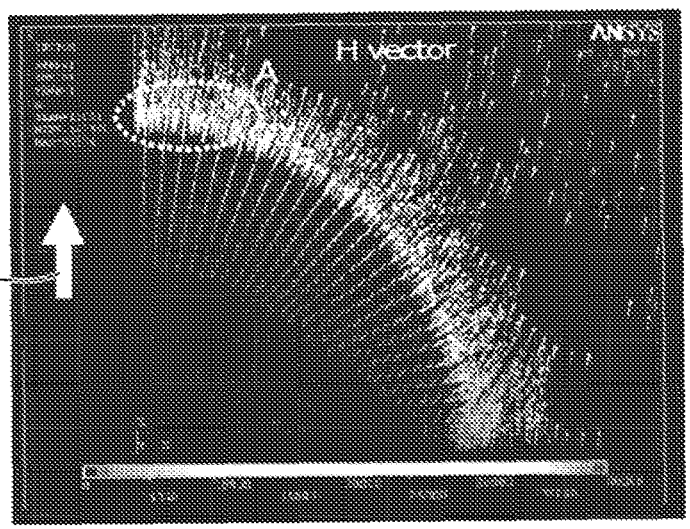
Figure 16A:
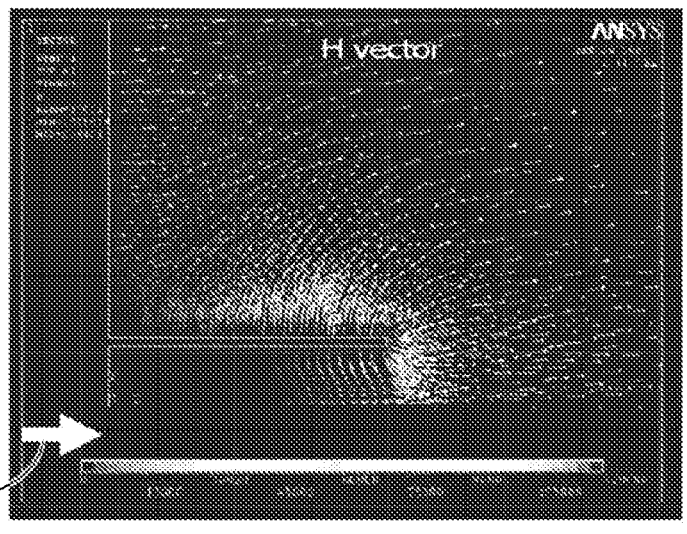
FIGS. 16A and 16B are analytical diagrams at the time of outer magnetic field application of the model 2 according to the embodiment.
Figure 16B:
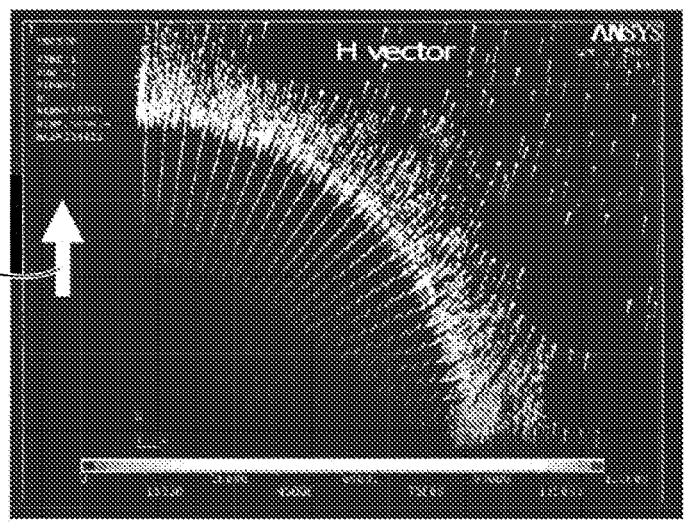

It is seen from FIGS. 15A, 15B, 16A, and 16B that magnetic fields concentrate around the magnetic shield plates and, in particular, a magnetic field intensity in a portion indicated by A in FIG. 15A is large. On the other hand, a magnetic field intensity value on an inner side of the magnetic shield plates (in the figure, below the magnetic shield plates) indicated by B in FIG. 15A (B is also in FIG. 16A, although not shown in the figure) takes a small value. From this result, it is seen that outer magnetic fields are collected by the magnetic shield plates and shield leakage of outer magnetic fields to an inner space sandwiched by the two magnetic shield plates. It is also seen from the plane analysis results shown in FIGS. 15B and 16B that the outer magnetic fields are also emitted from the magnetic shield plates (or intrude into the magnetic shield plates) from the magnetic shield plates substantially perpendicular to facets.

Here, the magnetic field intensities in the plane analysis results in FIGS. 15A, 15B, 16A, and 16B and the plane analysis results in FIGS. 12A, 12B, 13A, and 13B are different. This indicates that, in two types of magnetic shield plates, that is, the square and the circular magnetic shield plates, areas and volumes of planes of the magnetic shield plates are equal but, since side areas and planar shapes thereof are different, magnetic intensities in terms of magnetic intensities in a surface direction are different and concentration states of magnetic fields are different. It is seen that an effect of the circular magnetic shield plate is more excellent.

Figure 17A:
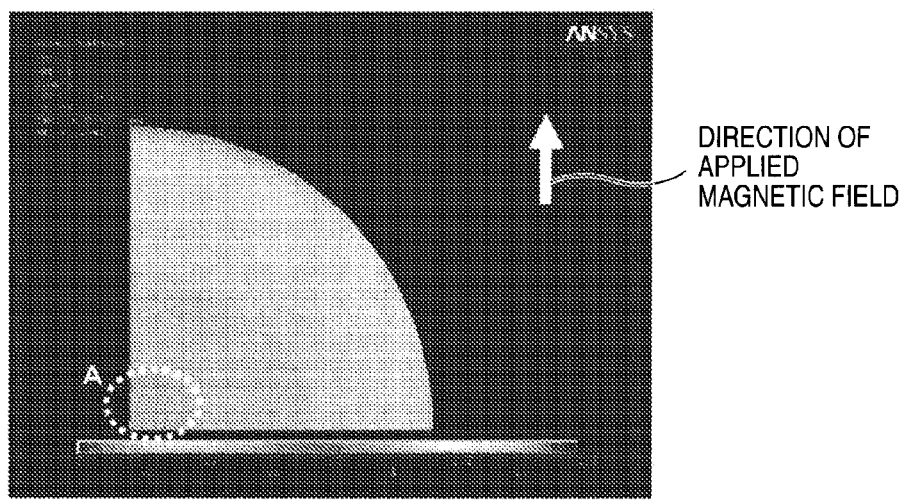
FIGS. 17A and 17B are analytical diagrams showing a magnetization intensity in the magnetic shield plate of the model 2 according to the embodiment.
Figure 17B:
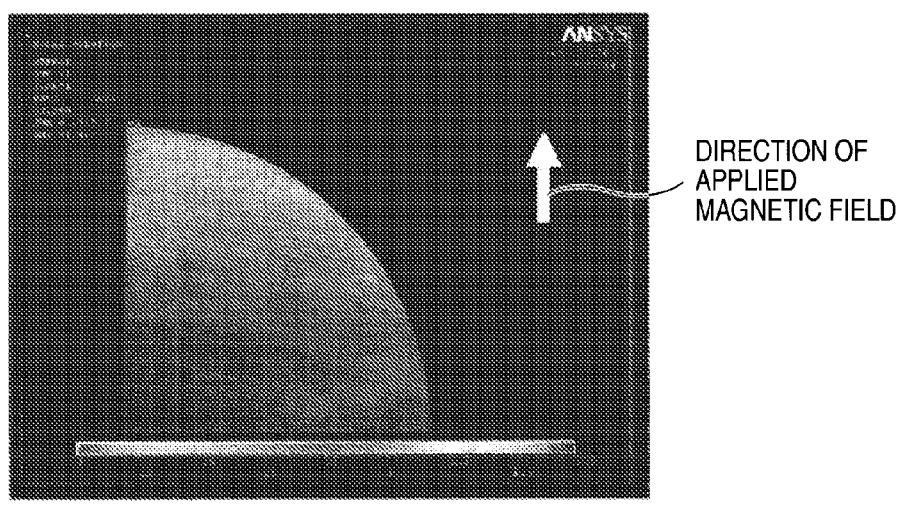

FIGS. 17A and 17B show plane analysis results of magnetization states inside the magnetic shield plates in the model 2. An outer magnetic field direction is indicated by an arrow. An area indicated by light and shade indicates a magnetic flux density [T] inside the respective magnetic shield plates. It is indicated that the magnetic flux density is larger in a darker area and the magnetic flux density is getting smaller toward a lighter area.

It is seen from FIGS. 17A and 17B that, in the model 2, the magnetic shield plates start to be saturated from a center portion of a facet parallel to the outer magnetic field direction (A in FIG. 17A) as the outer magnetic field increases in size. This is a result different from the square magnetic shield plate and indicates that a magnetic flux density at an end is dispersed uniformly by forming the magnetic shield plate in a circular shape and magnetic saturation at the end is relaxed. In addition, when a magnetic field of 23873.24 A/m (300 Oe) is applied, as shown in FIG. 17B, a portion indicating a magnetic flux density of 1.6 T or more is not observed either. Thus, it is seen that magnetic saturation does not occur in the circular magnetic shield plate.

FIGS. 18A and 18B show magnetic intensity distribution on an inner middle surface sandwiched by two magnetic shield plates in the cases in which magnetic fields of 7957.75 A/m (100 Oe) and 23873.24 A/m (300 Oe) are applied to the square magnetic shield plate (model 1) as a magnetic field intensity with respect to a distance from a center point of the magnetic shield plates in respective directions.

Figure 19A:
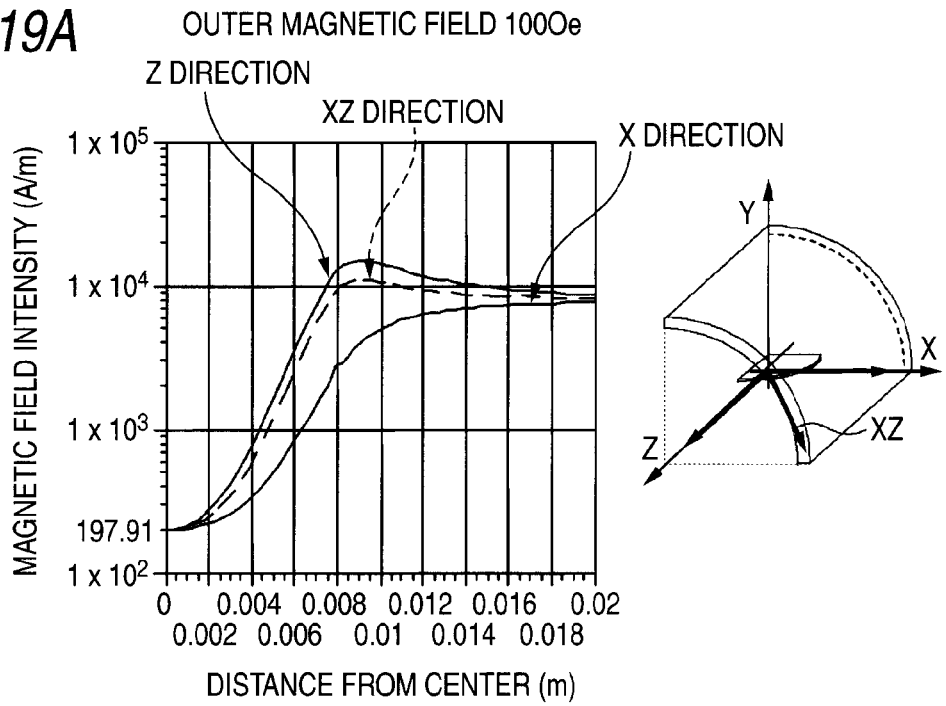
FIGS. 19A and 19B are graphs showing a leak magnetic field with respect to a distance from a center of the magnetic shield plate of the model 2 according to the embodiment.
Figure 19B:
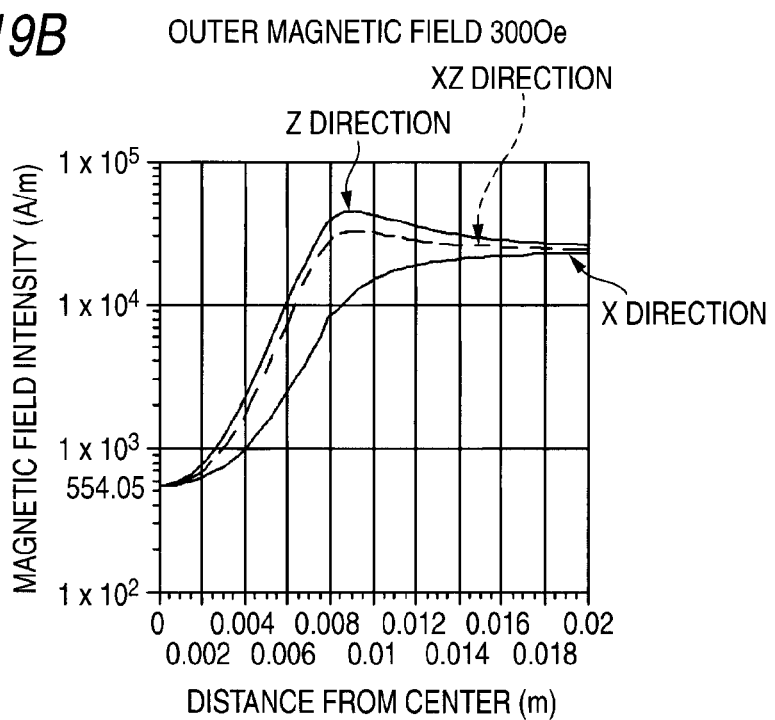
Figure 20:
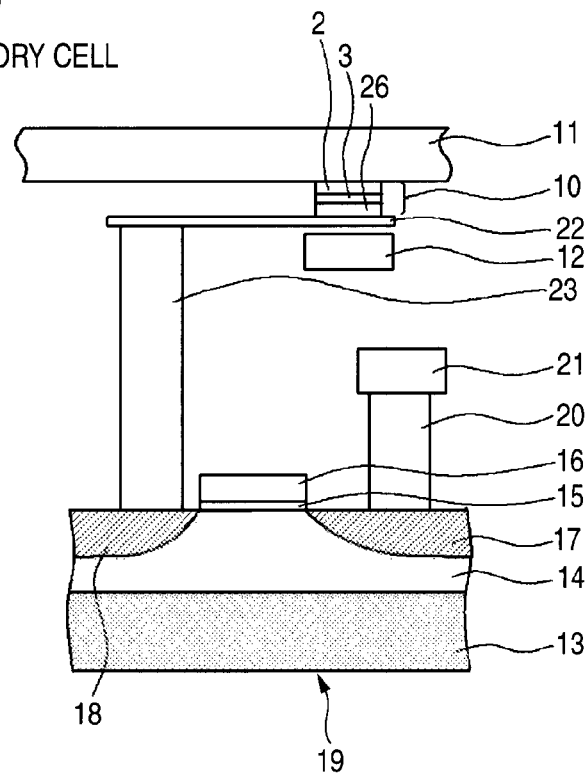
FIG. 20 is a schematic sectional view of a memory cell of an MRAM.
Figure 21:
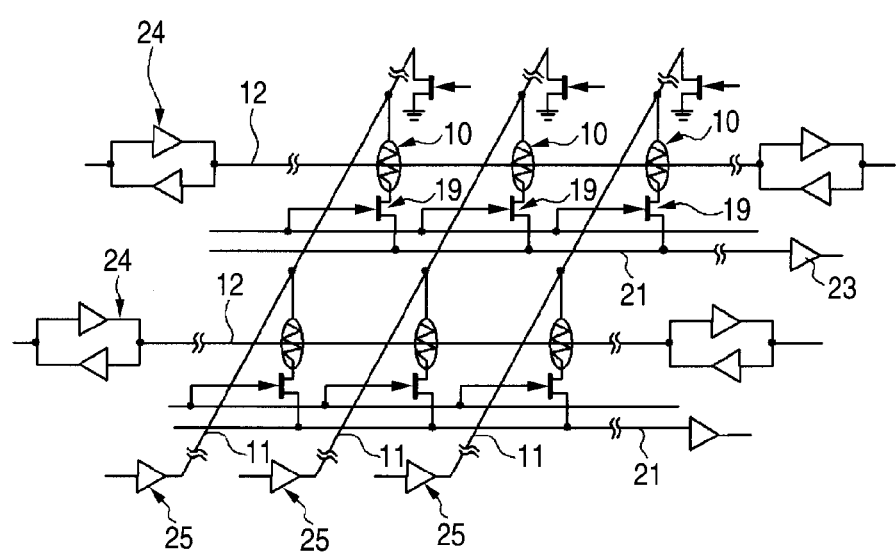
FIG. 21 is an equivalent circuit diagram of the MRAM.
Figure 22:
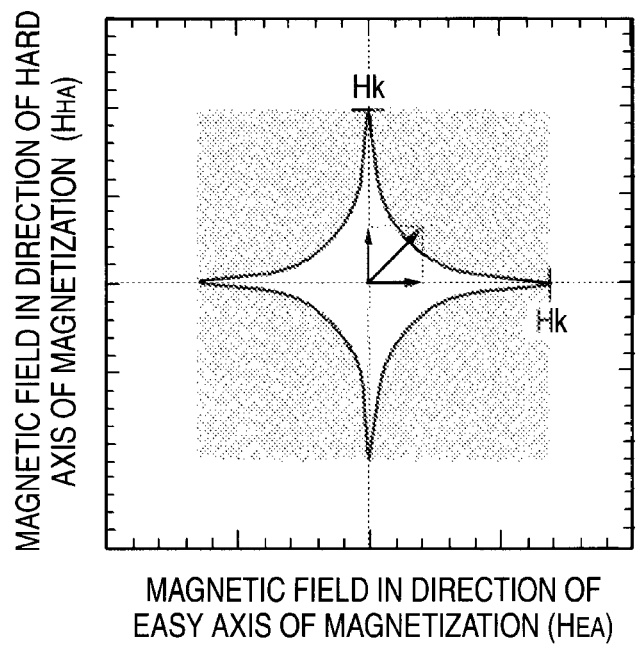
FIG. 22 is a magnetic field response characteristic diagram at the time of writing in the MRAM.
Figure 23:
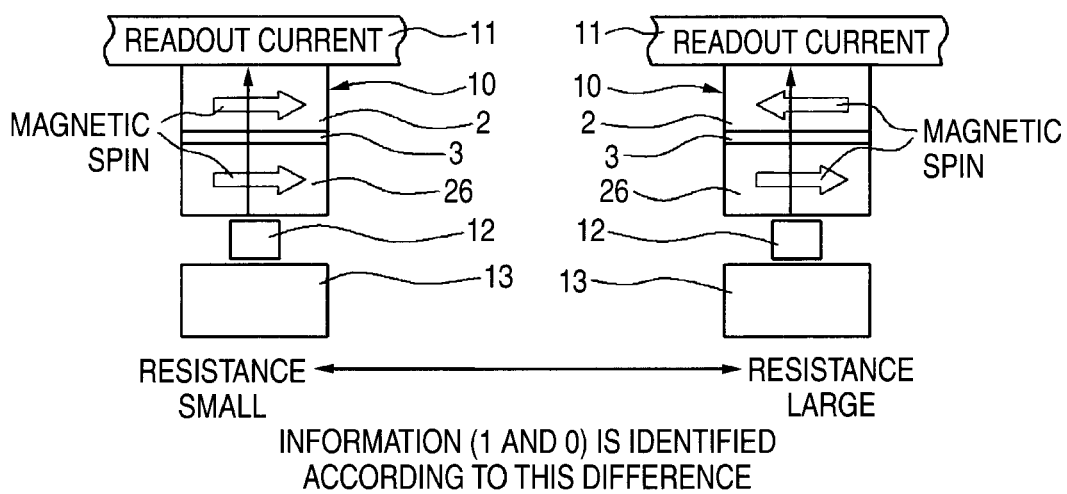
FIG. 23 is a principle diagram of a readout operation of the MRAM.

Similarly, FIGS. 19A and 19B show magnetic intensity distribution on an inner middle surface sandwiched by two magnetic shield plates in the cases in which magnetic fields of 7957.75 A/m (100 Oe) and 23873.24 A/m (300 Oe) are applied to the circular magnetic shield plate (model 2) as a magnetic field intensity with respect to a distance from a center point of the magnetic shield plates in respective directions.

It is seen from FIGS. 18A and 19A that, in a state in which the respective magnetic shield plates are not magnetically saturated, that is, in the case in which the outer magnetic field of 7957.75 A/m (100 Oe) is applied, magnetic intensities in centers of the magnetic shield plates are about 200 A/m and there is no great difference between the magnetic intensities. Thus, it is possible to use the magnetic shield plates as satisfactory magnetic shields. However, in the case in which the magnetic field of 23873.24 A/m (300 Oe) is applied, as shown in FIGS. 18B and 19B, whereas a magnetic intensity in the center of the square magnetic shield plate is 1702.4 A/m, a magnetic intensity in the center of the circular magnetic shield plate is 554.05 A/m. It is seen that the circular shield has a shield effect three times as high as that of the square shield. This is due to presence or absence of magnetic saturation inside the magnetic shield plates.

It is seen from the above that it is possible to improve the magnetic shield effect by adopting a shape and a structure of a magnetic shield plate that prevent magnetic lines of force from concentrating inside the magnetic shield plate, that is, prevent a magnetic flux density from being saturated taking into account an outer magnetic field direction and on the basis of the invention.

Note that, in the embodiment described above, the planar shape of the magnetic shield plate is circular. However, the same results are obtained when the magnetic shield plates of the other various shapes shown in FIGS. 2A to 2C are used. It is also understood from the above results that the magnetic shield plates of the sectional shapes shown in FIG. 3 and FIGS. 4A to 4C can also relax magnetic saturation with respect to intrusion and emission of an outer magnetic field in a sectional direction. When a planar shape and a sectional shape are selected out of the planar shapes in FIG. 1 and FIGS. 2A to 2C and the sectional shapes in FIG. 3 and FIGS. 4A to 4C and used together, the magnetic shield effect further improves.

According to the invention, as a planar shape or/and a sectional shape of a magnetic shield, a magnetic shield shape is a shape in which angles formed by sides on an intrusion side and an emission side of an outer magnetic field and sides adjacent to the sides are obtuse angles, respectively, an m-sided polygon (m is an integer satisfying the condition $m \geq 4$) in which angles formed by the sides and the adjacent sides assume an outward curved line shape, or a shape in which a continuous surface over an entire area the magnetic shield and at least an intrusion side and an emission side of an outer magnetic field of outer peripheral sides thereof form an outward curved line shape. Thus, the sides and the adjacent sides of the magnetic shield on the intrusion side and the emission side of the outer magnetic field do not perpendicular to each other (or substantially perpendicular to each other), and it is possible to reduce concentration of magnetic fields, which intrude or are emitted from both the sides, in the magnetic shield. Consequently, it is possible to relax magnetic saturation and hold the magnetic shield effect sufficiently.

What is claimed is:

1. A magnetic shield member comprising:
   a magnetic shield plate;
   wherein,
      in plan view or sectional view any two adjoining sides form an obtuse angle, and
      a ratio of a length of the magnetic shield plate in the longitudinal direction to a length of the magnetic shield plate in the horizontal direction in sectional view is equal to or greater than 5.

2. The magnetic shield member of claim 1, wherein the magnetic shield plate is a polygon with an even number of sides in plan view.

3. The magnetic shield member of claim 1, wherein the magnetic shield plate is a polygon with an even number of sides in sectional view.

4. The magnetic shield member of claim 1, wherein the magnetic shield plate is a polygon with an even number of sides in both sectional and plan views.

5. The magnetic shield member of claim 1, wherein the magnetic shield plate has eight sides in plan view.

6. The magnetic shield member as in any of the preceding claims, wherein the magnetic shield member is embedded in a sealing layer.

7. A magnetic memory device comprising:
   a magnetic shield plate; and
   a magnetic memory unit,
   wherein,
      in plan view or sectional view any two adjoining sides form an obtuse angle,
      a ratio of a length of the magnetic shield plate in the longitudinal direction to a length of the magnetic shield plate in the horizontal direction in sectional view is equal to or greater than 5, and
      at least one magnetic shield plate is provided on at least one sealing layer and opposed to the magnetic memory unit.

8. The magnetic shield member of claim 7, wherein
   the magnetic memory unit is a magnetic random access memory unit including a memory element formed by stacking a magnetization fixed layer with a fixed magnetization direction, and a magnetic layer, with an adjustable direction of magnetization, and
   the magnetic shield member opposes the magnetic random access memory unit.

9. The magnetic shield member according to claims 7 or 8, further comprising:
   a pair of the magnetic shield members parallel to each other,
   wherein,
      the magnetic memory unit is arranged between at least two magnetic shield members.

* * * * *